(12) United States Patent
Kong et al.

(10) Patent No.: US 12,074,054 B2
(45) Date of Patent: Aug. 27, 2024

(54) WAFER PROCESSING APPARATUS AND WAFER PROCESSING METHOD

(71) Applicant: ZEUS CO., LTD., Hwaseong-si (KR)

(72) Inventors: Woon Kong, Cheonan-si (KR); Ji Hoon Song, Cheonan-si (KR); Ung Jo Moon, Osan-si (KR); Ji Ho Park, Hwaseong-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 291 days.

(21) Appl. No.: 17/407,567

(22) Filed: Aug. 20, 2021

(65) Prior Publication Data

US 2022/0068696 A1   Mar. 3, 2022

(30) Foreign Application Priority Data

Aug. 25, 2020   (KR) .................. 10-2020-0106760

(51) Int. Cl.
*H01L 21/683*   (2006.01)
*H01L 21/687*   (2006.01)

(52) U.S. Cl.
CPC .... *H01L 21/6838* (2013.01); *H01L 21/68721* (2013.01); *H01L 21/68764* (2013.01); *H01L 21/68728* (2013.01); *Y10T 279/11* (2015.01)

(58) Field of Classification Search
CPC ........... H01L 21/6838; H01L 21/68721; H01L 21/68764; H01L 21/68728; Y10T 279/11; F16J 15/027
See application file for complete search history.

(56) References Cited

U.S. PATENT DOCUMENTS

| 4,603,867 A | * | 8/1986 | Babb | ..................... B23B 31/307 451/388 |
| 2004/0195783 A1 | * | 10/2004 | Akagi | ..................... F16J 15/027 277/645 |
| 2016/0300751 A1 | * | 10/2016 | Albert | ............... H01L 21/67126 |

FOREIGN PATENT DOCUMENTS

KR   10-2016-0122067   10/2016

* cited by examiner

*Primary Examiner* — Sunil K Singh
*Assistant Examiner* — Eric Daniel Whitmire
(74) *Attorney, Agent, or Firm* — KILE PARK REED & HOUTTEMAN PLLC

(57) ABSTRACT

A wafer processing apparatus includes a vacuum chuck on which a wafer is seated, a ring cover disposed along a circumferential portion of the vacuum chuck to press the wafer to seal the circumferential portion of the vacuum chuck, and a sealing ring pressed against an adhesive sheet on the wafer and pressed by the ring cover.

8 Claims, 29 Drawing Sheets

A-A' CROSS SECTION

WAFER PROCESSING APPARATUS AND WAFER PROCESSING METHOD

CROSS-REFERENCE TO RELATED APPLICATION

This application claims the benefit under 35 U.S.C. § 119(a) of Korean Patent Application No. 10-2020-0106760 filed on Aug. 25, 2020 in the Korean Intellectual Property Office, the entire disclosure of which is incorporated herein by reference for all purposes.

BACKGROUND

Field of the Invention

The present invention relates to a wafer processing apparatus and a wafer processing method, and more particularly, to a wafer processing apparatus and a wafer processing method which are capable of improving processing performance of a substrate and reducing a processing time of the substrate.

Discussion of Related Art

Generally, in a semiconductor process, an etching process of etching a wafer, a singulation process of cutting the wafer into a plurality of dies, and a cleaning process of cleaning the wafer are performed. A wafer processing apparatus is used in a wafer etching process or a wafer cleaning process.

The wafer processing apparatus includes a rotating table rotatably installed and having an upper portion on which a wafer is seated, and a sealing ring coupled to an edge of the rotating table in the form of a ring. In a state in which the rotating table is rotated, a treatment solution is supplied onto the wafer seated on the rotating table.

However, in the existing wafer processing apparatus, it may be difficult to remove foreign materials remaining in gaps between a plurality of dies when the wafer in which the plurality of dies are cut is cleaned. In addition, in order to remove the foreign materials from the gaps between the plurality of dies, since a cleaning time should be sufficiently extended, the cleaning time may be increased.

In addition, a process of coupling the sealing ring to the upper portion of the rotating table is cumbersome, and during the process of coupling, a coupling completion state of the sealing ring is not constant, and thus coupling errors (misalignment, and the like) may occur. Furthermore, when a coupling error of the sealing ring occurs, since the treatment solution infiltrates into an outer side of the sealing ring, a structure in a circumferential portion of the rotating table may be damaged.

In addition, in order to prevent a position of the wafer from being varied, a wafer fixing module is installed and a sealing ring fixing module for fixing the sealing ring is installed. Accordingly, a structure of the wafer processing apparatus may be complicated, and a manufacturing cost may be increased.

The background art of the present invention is disclosed in Korean Patent Laid-Open Application No. 10-2016-0122067 (published on Oct. 21, 2016, entitled "Wafer Treating Device and Sealing Ring for A Wafer Treating Device").

SUMMARY OF THE INVENTION

The present invention is directed to a wafer processing apparatus and a wafer processing method which are capable of improving processing performance of a substrate and reducing a processing time of the substrate.

According to an aspect of the present invention, there is provided a wafer processing apparatus including a vacuum chuck on which a wafer is seated, a ring cover disposed along a circumferential portion of the vacuum chuck to press the wafer to seal the circumferential portion of the vacuum chuck, and a sealing ring pressed against an adhesive sheet on the wafer and pressed by the ring cover.

A deformation space may be formed inside the sealing ring to allow the sealing ring to be deformed when the ring cover presses.

A sealing protrusion may be formed on the ring cover to be pressed against the sealing ring.

The sealing ring may further include a fluid supply part connected to the sealing ring to supply or discharge a fluid to or from the deformation space.

The sealing ring may further include a sealing force reinforcement part installed in the deformation space to elastically support the sealing ring.

An inner side of the sealing ring may be disposed to be buried below an outer circumferential surface of the vacuum chuck.

A sealing groove may be formed on an outer circumferential surface of the vacuum chuck to allow the sealing ring to be disposed in the sealing groove, and the ring cover may press a portion of the adhesive sheet facing the sealing groove to perform sealing due to tension of the adhesive sheet.

The ring cover may press an adhesive sheet on the wafer to prevent a supply solution from infiltrating into a retainer ring on the wafer.

The wafer processing apparatus may further include a plurality of suction pads installed on a vacuum port of the vacuum chuck to suction a retainer ring on the wafer.

The suction pad may include a suction body disposed above the vacuum port to suction the wafer, a flatness management part formed to be inclined toward a central portion of the suction body from a lower circumferential portion thereof to allow the vacuum port to be fitted, and a press-fitting fixing part formed in the flatness management part to be press-fitted in a fixing groove of the vacuum chuck.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

Figure 1:
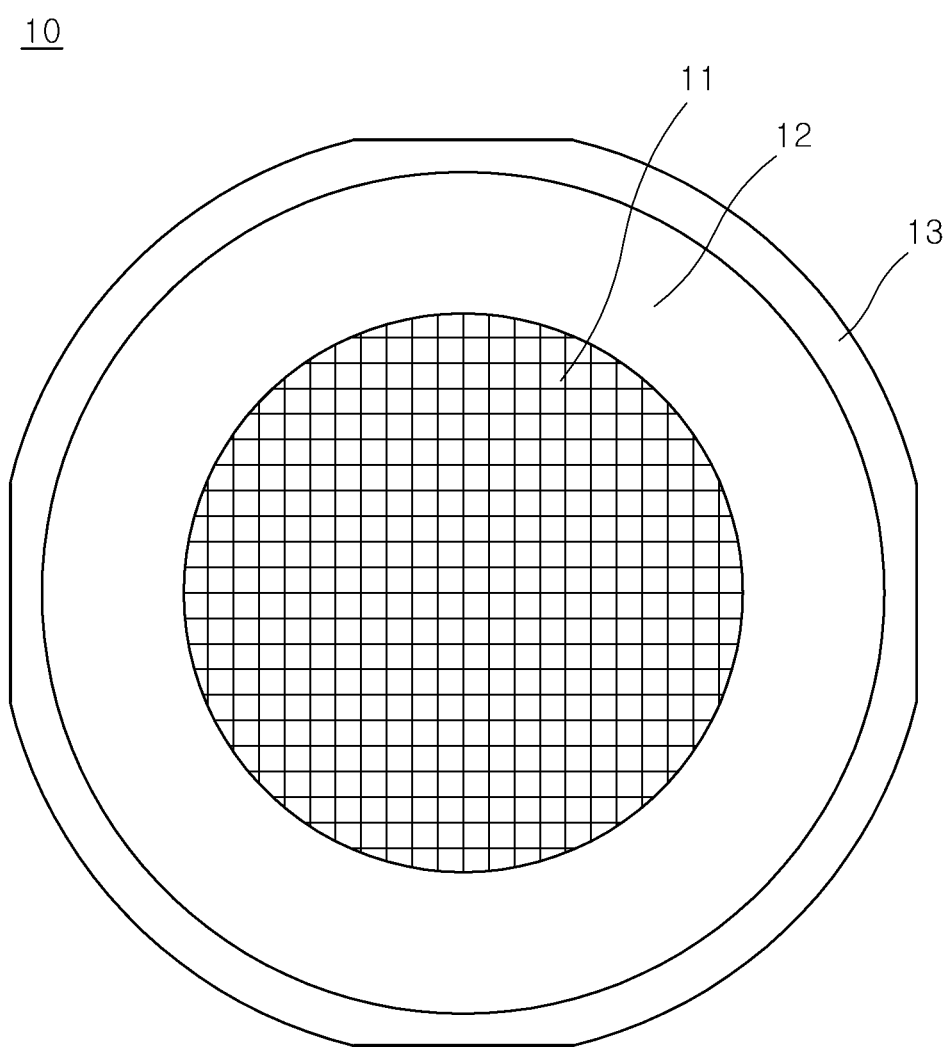
FIG. 1 is a schematic plan view illustrating a wafer processed in a wafer processing apparatus according to a first embodiment of the present invention.

Hereinafter, embodiments of a wafer processing apparatus and a wafer processing method according to the present invention will be described with reference to the accompanying drawings. In the following description of the wafer processing apparatus and the wafer processing method, thicknesses of lines and sizes of components shown in the drawings may be exaggerated for clarity and convenience of the description. In addition, the terms described below are defined in consideration of the functions in the present invention, and these terms may be varied according to the intent or custom of a user or an operator. Therefore, the definitions of the terms used herein should follow contexts disclosed herein.

Figure 2:
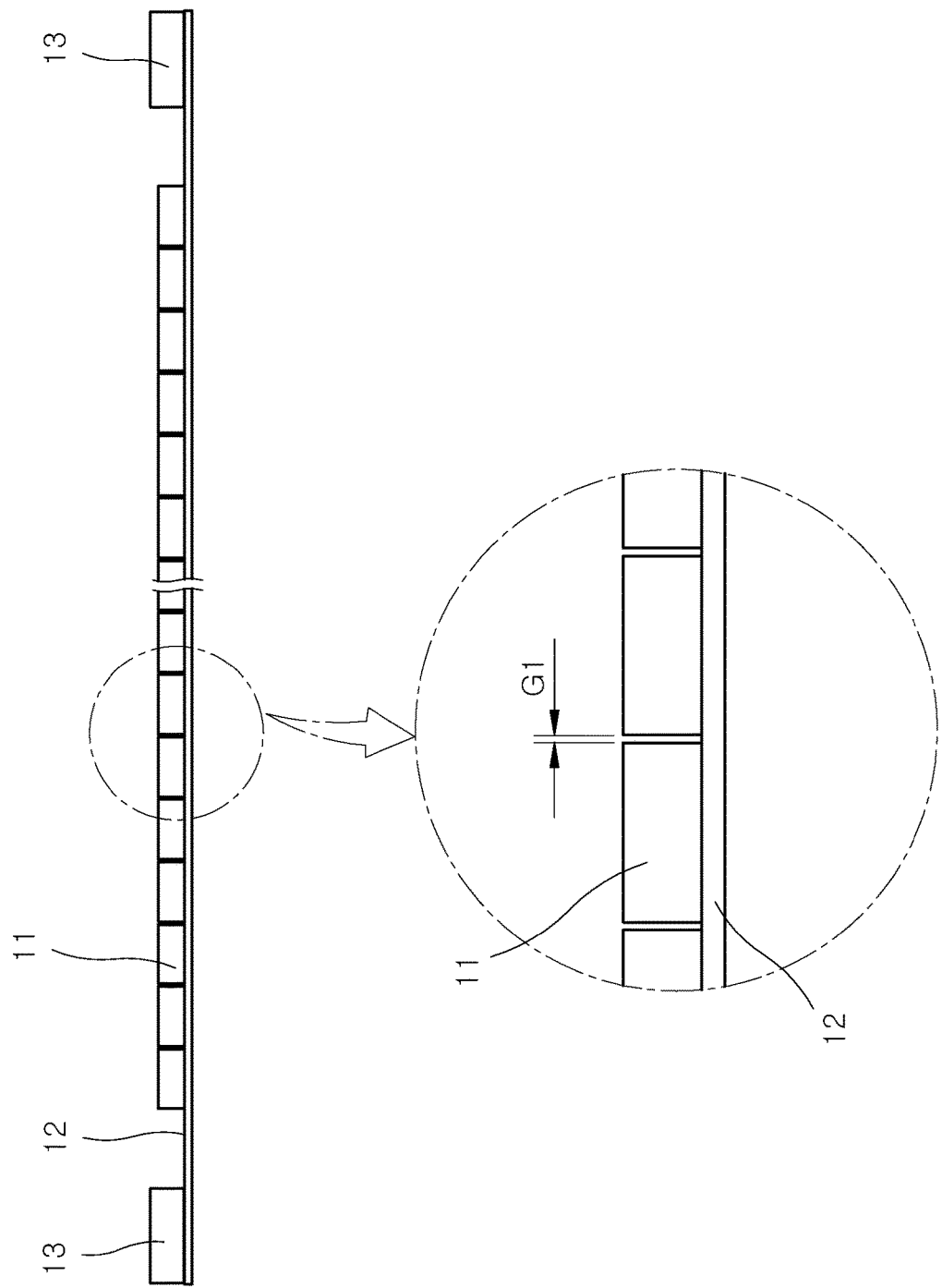
FIG. 2 is a schematic side view illustrating the wafer processed in the wafer processing apparatus according to the first embodiment of the present invention.
Figure 3:
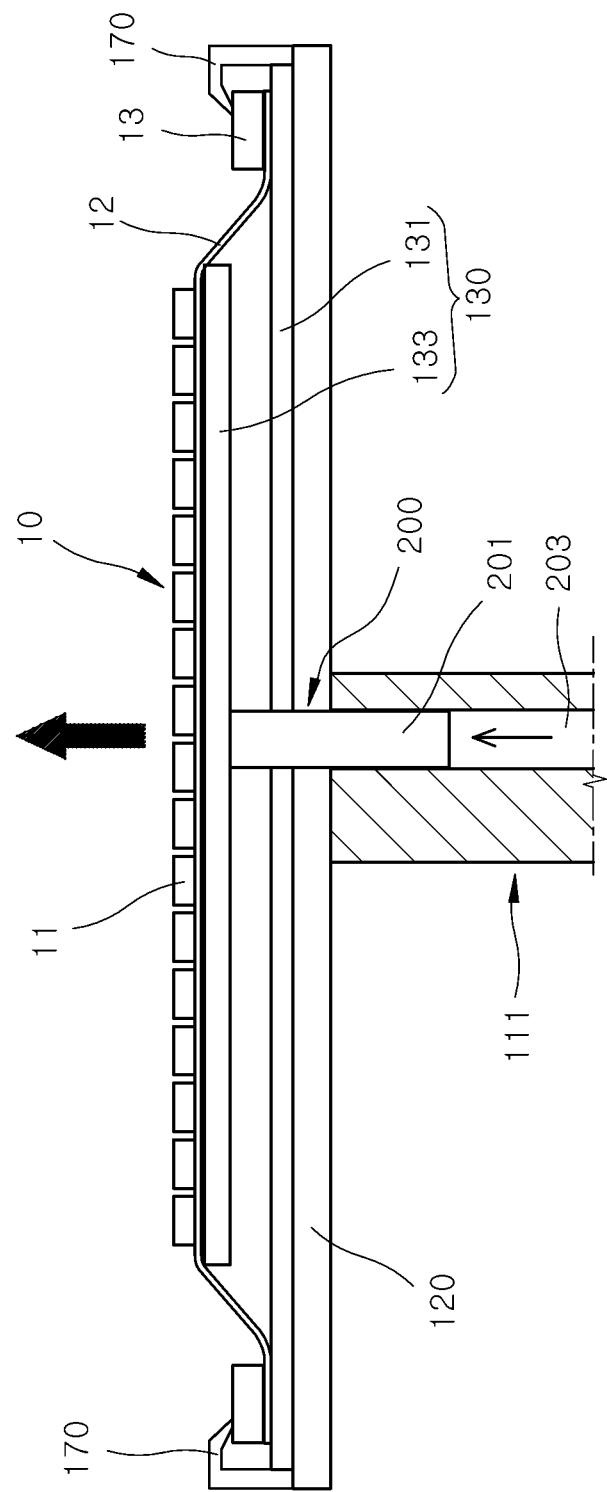
FIG. 3 is a schematic side view illustrating the wafer processing apparatus according to the first embodiment of the present invention.
Figure 4:
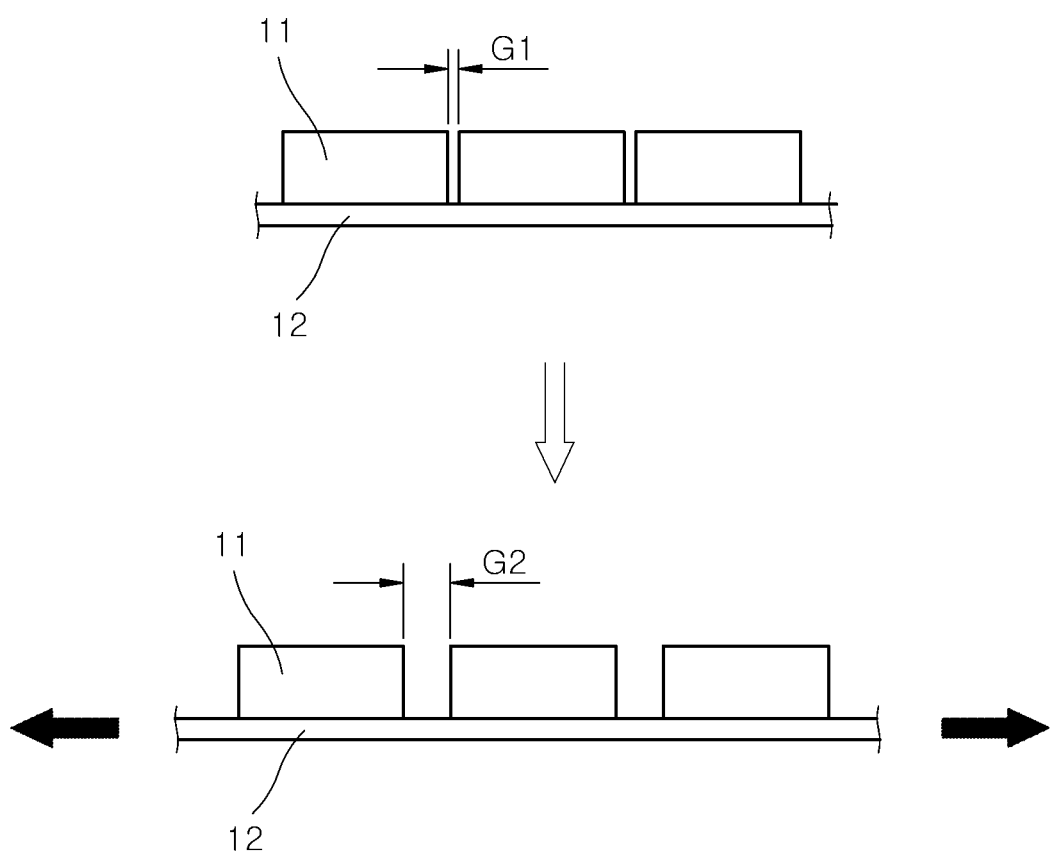
FIG. 4 is a schematic side view illustrating a state in which gaps between a plurality of dies are increased as a vacuum chuck is raised in the wafer processing apparatus according to the first embodiment of the present invention.

FIG. 1 is a schematic plan view illustrating a wafer processed in a wafer processing apparatus according to a first embodiment of the present invention, FIG. 2 is a schematic side view illustrating the wafer processed in the wafer processing apparatus according to the first embodiment of the present invention, FIG. 3 is a schematic side view illustrating the wafer processing apparatus according to the first embodiment of the present invention, and FIG. 4 is a schematic side view illustrating a state in which gaps between a plurality of dies are increased as a vacuum chuck is raised in the wafer processing apparatus according to the first embodiment of the present invention.

Referring to FIGS. 1 to 4, the wafer processing apparatus according to the first embodiment of the present invention includes a rotating chuck 120, a vacuum chuck 130, a chuck module 150, and a moving module 200.

The wafer processing apparatus etches and cleans a wafer 10. In an etching process, an etching solution is sprayed onto the wafer 10. The etched wafer 10 is cut in the form of a matrix in a singulation process so that a plurality of dies 11 are formed. In a cleaning process, a cleaning solution is sprayed onto the wafer 10, and thus foreign materials attached on the plurality of dies 11 are removed. Various types of solutions such as deionized water (DI-water) and the like may be applied as the cleaning solution. The etching solution and the cleaning solution which are supplied to the wafer processing apparatus in the etching process and the cleaning process are referred to as supply solutions.

The wafer 10 includes the plurality of dies 11 disposed in the form of a matrix, an adhesive sheet 12 on which the plurality of dies 11 are attached, and a retainer ring 13 connected to a circumferential portion of the adhesive sheet 12 to tightly support the adhesive sheet 12. The adhesive sheet 12 is made of a material which is stretchable in a transverse direction. The adhesive sheet 12 is tightly pulled by the retainer ring 13, and thus the plurality of dies 11 are fixed in position and the thin-plate type die 11 maintains the form of a flat plate.

The rotating chuck 120 is rotatably installed on a driver 110. The entirety of the rotating chuck 120 may be formed in the form of a circular plate.

The driver 110 includes a rotating shaft 111 connected to a rotation center of the rotating chuck 120, and a motor 113 installed on the rotating shaft 111. The motor 113 includes a stator (not shown) installed inside a housing (not shown), and a rotor (not shown) disposed inside the stator and installed to surround the rotating shaft 111. In addition, a belt driving scheme for rotating the rotating shaft 111 through a belt or a chain driving scheme for rotating the rotating shaft 111 through a chain may be applied to the driver 110. Various types of driving schemes may be applied to the driver 110 as long as they can rotate the rotating chuck 120.

A vacuum flow path 115 (see FIGS. 7 and 9) is formed in the rotating shaft 111 to vacuum the vacuum chuck 130. The vacuum flow path 115 is formed in a lengthwise direction of the rotating shaft 111. A vacuum chamber 135 is formed in the vacuum chuck 130 to be connected to the vacuum flow path 115.

The vacuum chuck 130 is disposed on the rotating chuck 120, and the wafer 10 is seated on the vacuum chuck 130. The entirety of the vacuum chuck 130 is formed in the form of a circular plate to be seated on an upper portion of the rotating chuck 120. When the driver 110 is driven, the vacuum chuck 130 is rotated together with the rotating chuck 120. In this case, when an etching process is performed in the wafer processing apparatus, the wafer 10 in which the plurality of dies 11 are not cut is seated on the vacuum chuck 130. When a cleaning process is performed in the wafer processing apparatus, the wafer 10 in which the plurality of dies 11 are cut is seated on the vacuum chuck 130. When the dies 11 are cut from the wafer 10, foreign materials may remain on surfaces of the dies 11 and in gaps between the dies 11.

The chuck module 150 (see FIG. 7) is installed in the vacuum chuck 130 to fix the retainer ring 13 on the wafer 10 to the vacuum chuck 130. The chuck module 150 presses the retainer ring 13 downward to fix the retainer ring 13 to a circumferential portion of the vacuum chuck 130. Therefore, when the rotating chuck 120 and the vacuum chuck 130 are rotated, the chuck module 150 prevents a position variation of the wafer 10 and allows the wafer 10 to be maintained in a flat state.

The moving module 200 is installed to move the vacuum chuck 130 or the chuck module 150 to increase the gap between the dies 11 of the wafer 10. When the moving module 200 is moved in a state in which the chuck module 150 fixes the retainer ring 13 on the wafer 10 to the circumferential portion of the vacuum chuck 130, the wafer 10 is pressed due to the movement of the moving module 200. In this case, as the adhesive sheet 12 on the wafer 10 is pulled in a radial direction, the adhesive sheet 12 is stretched in the radial direction, and as the adhesive sheet 12 is stretched in the radial direction, the gaps between the plurality of dies 11 are increased. When the cleaning solution is sprayed onto the plurality of dies 11 in a state in which the gaps between the plurality of dies 11 are increased, foreign materials attached on the surfaces of the plurality of dies 11 as well as foreign materials located in the gaps between the plurality of dies 11 may be easily removed due to the cleaning solution. Therefore, cleaning performance with respect to the foreign materials on the wafer 10 may be significantly improved. In addition, as the cleaning performance of the wafer 10 is significantly improved, a defective rate in the wafer 10 may be significantly reduced.

In the wafer 10, as the plurality of dies 11 are moved in a state in which the retainer ring 13 is fixed in position, the gaps between the plurality of dies 11 may be increased, whereas as the retainer ring 13 is moved in a state in which the plurality of dies 11 are fixed in position, the gaps between the plurality of dies 11 may be increased. This will be described in detail below.

The moving module 200 is installed on the rotating chuck 120 to move the vacuum chuck 130. For example, the moving module 200 moves the vacuum chuck 130 upward, and the rotating chuck 120 is maintained in a state of being fixed in position. In this case, the circumferential portion of the vacuum chuck 130 supports the adhesive sheet 12 on the wafer 10. As the moving module 200 is driven, the vacuum chuck 130 is moved upward and the rotating chuck 120 is not raised so that, in a state in which the retainer ring 13 on the wafer 10 is fixed in position, the adhesive sheet 12 is raised to be stretched in the radial direction. As the adhesive sheet 12 is stretched in the radial direction, the gaps between the plurality of dies 11 are increased.

Figure 5:
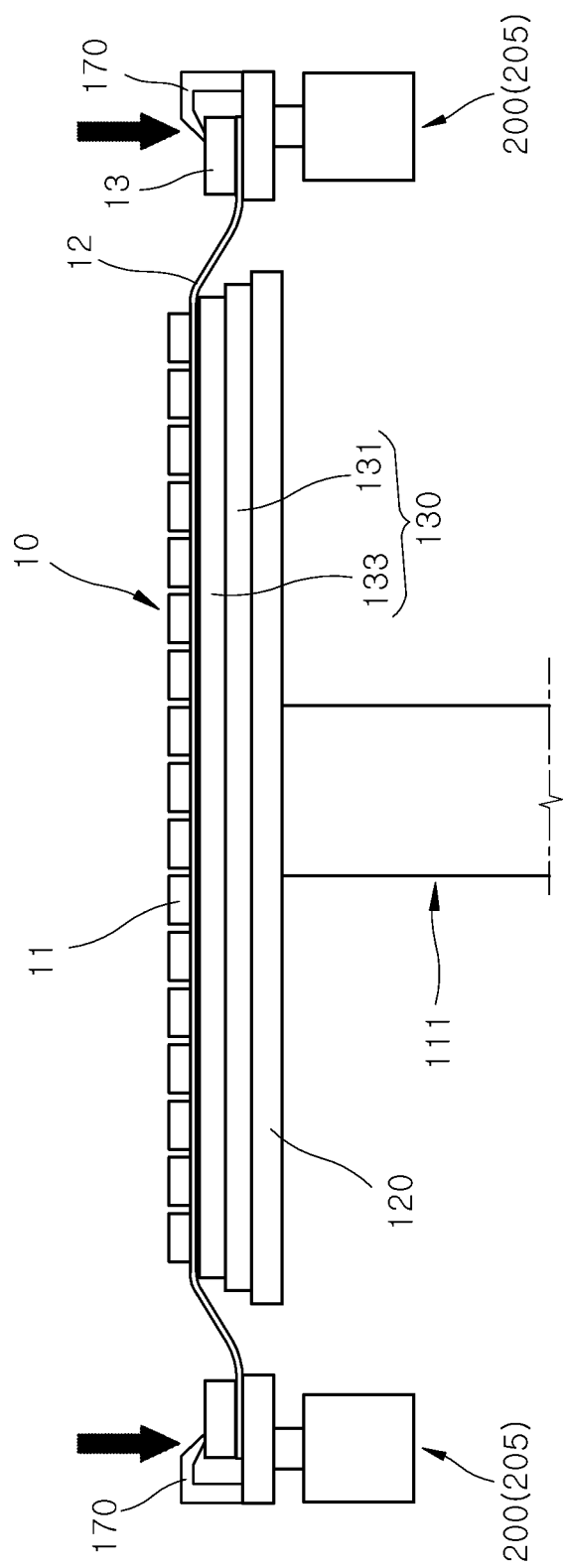
FIG. 5 is a schematic side view illustrating a wafer processing apparatus according to a second embodiment of the present invention.

FIG. 5 is a schematic side view illustrating a wafer processing apparatus according to a second embodiment of the present invention.

Referring to FIG. 5, the moving module 200 is installed on the rotating chuck 120 to move the chuck module 150. For example, the moving module 200 moves the chuck module 150 downward. In this case, the circumferential portion of the vacuum chuck 130 supports the adhesive sheet 12 on the wafer 10. As the moving module 200 is driven, the chuck module 150 is moved downward and the rotating chuck 120 and the vacuum chuck 130 are not raised so that, in a state in which the plurality of dies 11 of the wafer 10 are fixed in position on the vacuum chuck 130, the retainer ring 13 is lowered and thus the adhesive sheet 12 is stretched in the radial direction. As the adhesive sheet 12 is stretched in the radial direction, the gaps between the plurality of dies 11 are increased.

Figure 6:
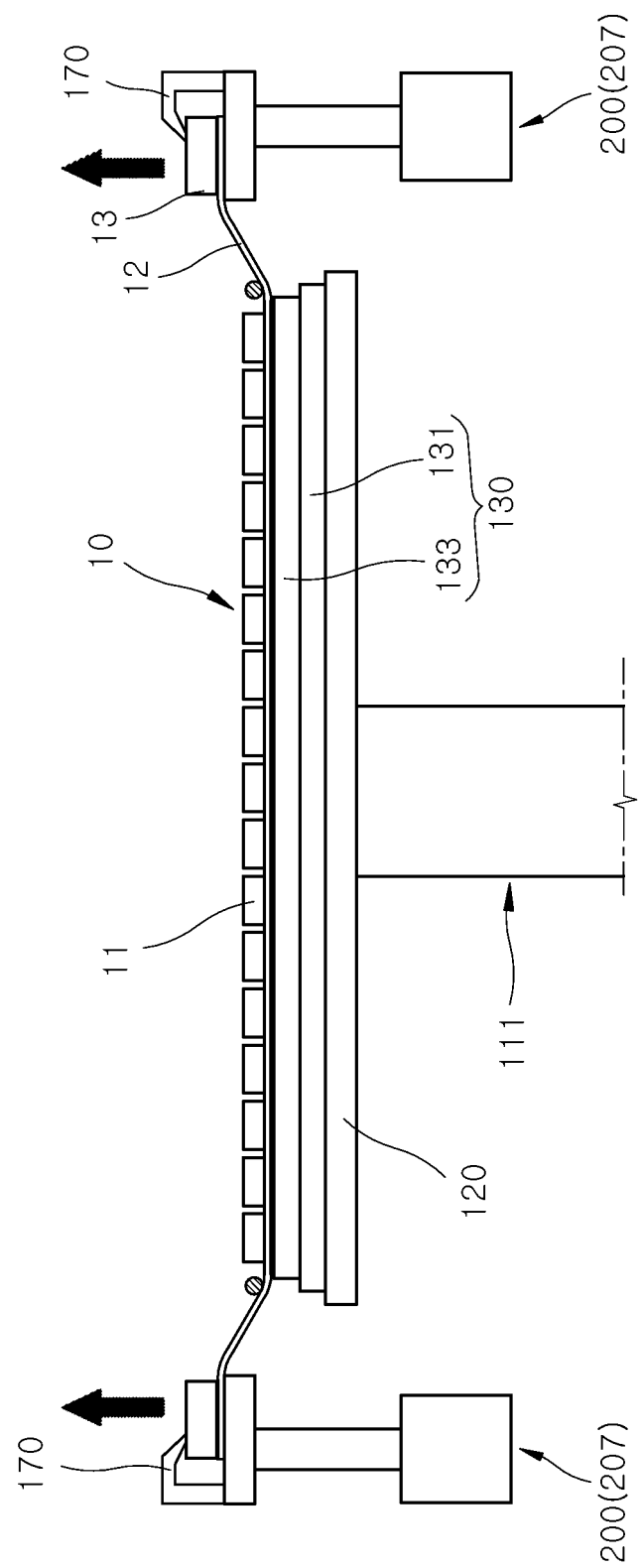
FIG. 6 is a schematic side view illustrating a wafer processing apparatus according to a third embodiment of the present invention.

FIG. 6 is a schematic side view illustrating a wafer processing apparatus according to a third embodiment of the present invention.

Referring to FIG. 6, the moving module 200 is installed on the rotating chuck 120 to move the chuck module 150 upward. A structure (not shown) supporting the chuck module 150 to be raisable and lowerable may be installed on a circumferential portion of the rotating chuck 120. A structure, such as a ring cover 140, that is capable of pressing the adhesive sheet 12 located inside the retainer ring 13 is installed above the circumferential portion of the rotating chuck 120. In this case, the adhesive sheet 12 on the wafer 10 is supported to not be raised by the structure such as the ring cover 140. As the moving module 200 is driven, the chuck module 150 is moved upward and the rotating chuck 120 and the vacuum chuck 130 are not raised so that, in a state in which the plurality of dies 11 of the wafer 10 are fixed in position on the vacuum chuck 130, the retainer ring 13 is raised and thus the adhesive sheet 12 is stretched in the radial direction. As the adhesive sheet 12 is stretched in the radial direction, the gaps between the plurality of dies 11 are increased.

Various types of modules may be applied as the moving module 200 as long as the modules can move the vacuum chuck 130 or the chuck module 150. Embodiments of the moving module 200 will be described below.

Figure 7:
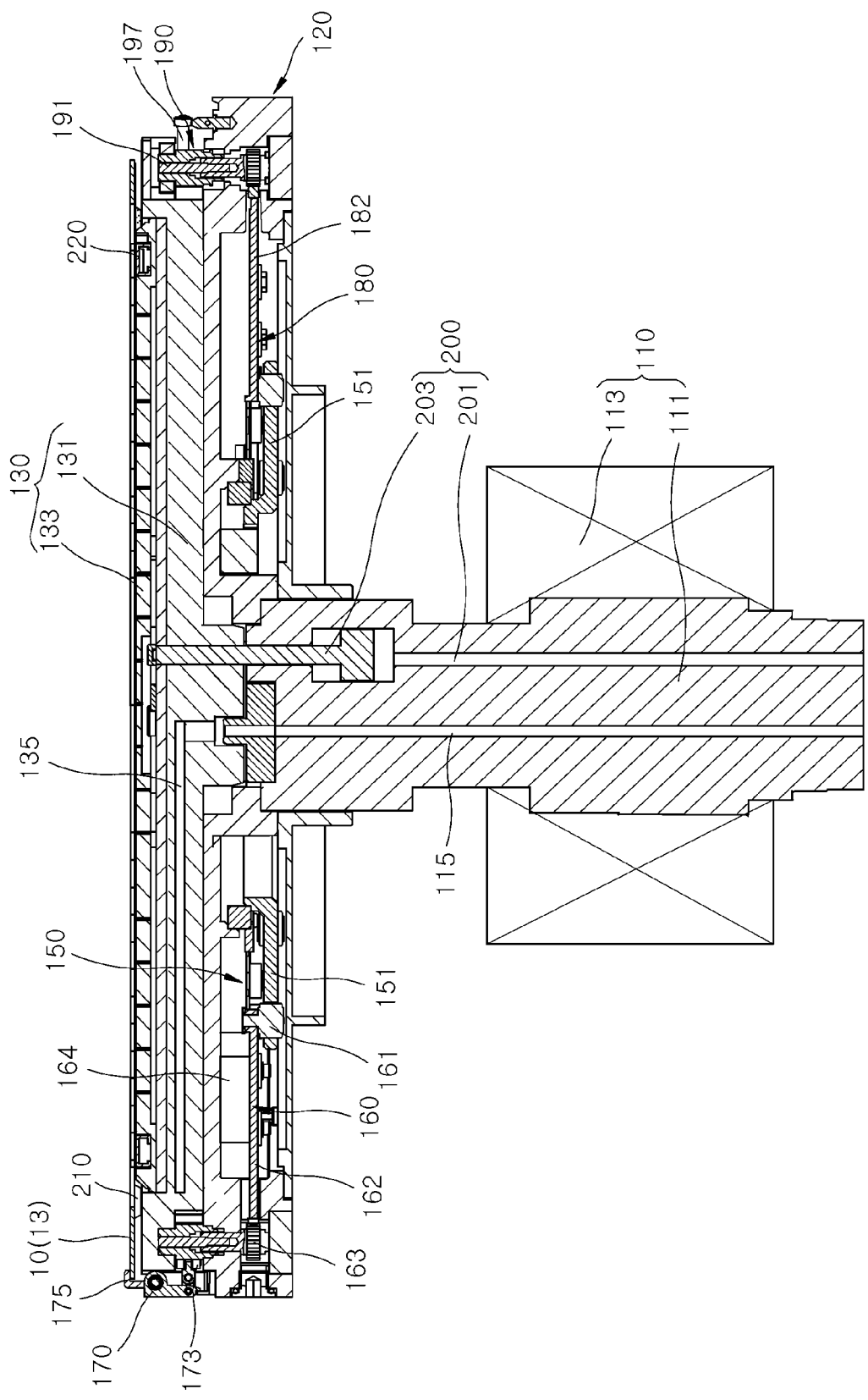
FIG. 7 is a schematic cross-sectional view illustrating the wafer processing apparatus according to the first embodiment of the present invention.
Figure 8:
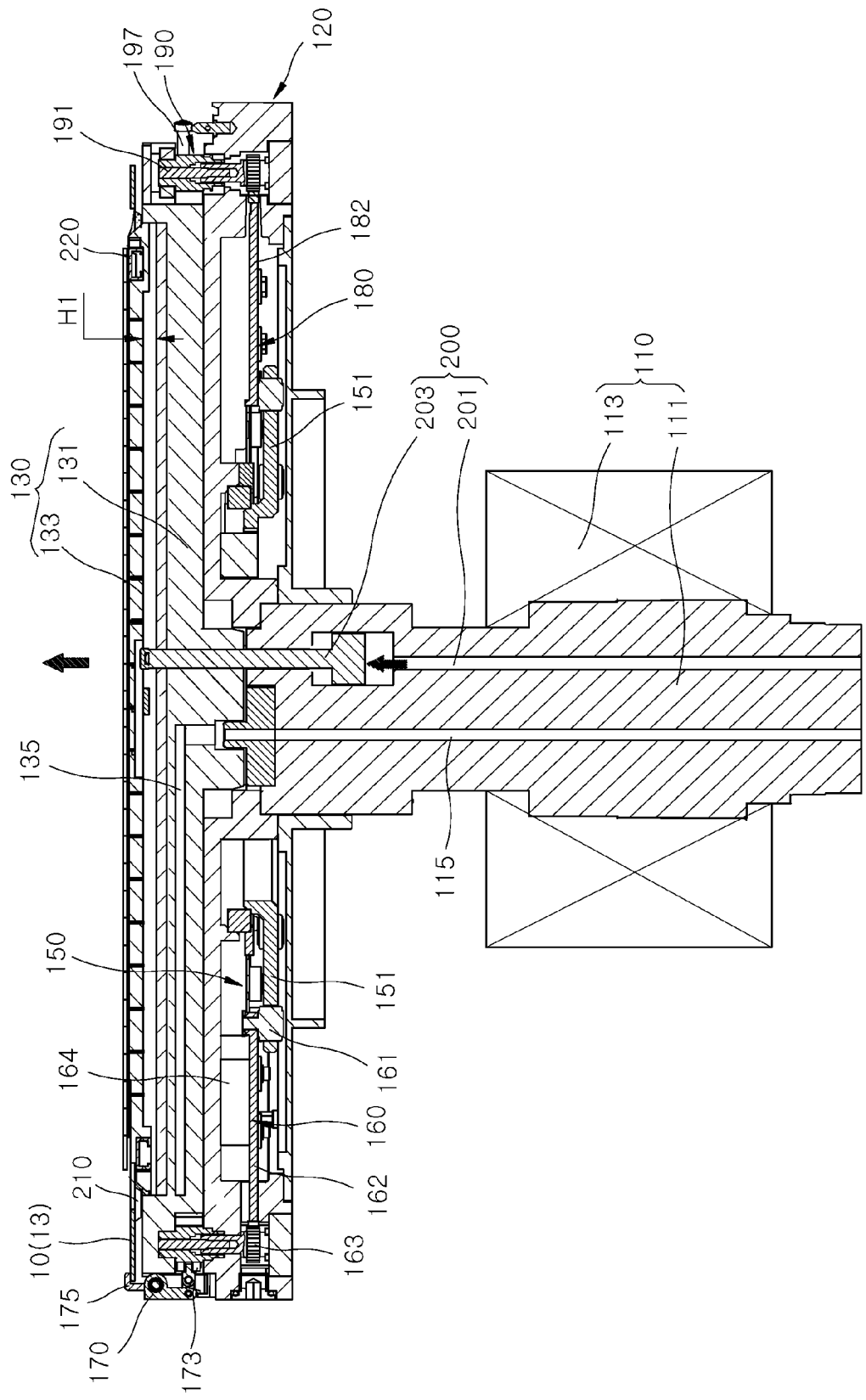
FIG. 8 is a schematic cross-sectional view illustrating a state in which a vacuum chuck is raised to a predetermined height by a moving module in the wafer processing apparatus according to the first embodiment of the present invention.
Figure 9:
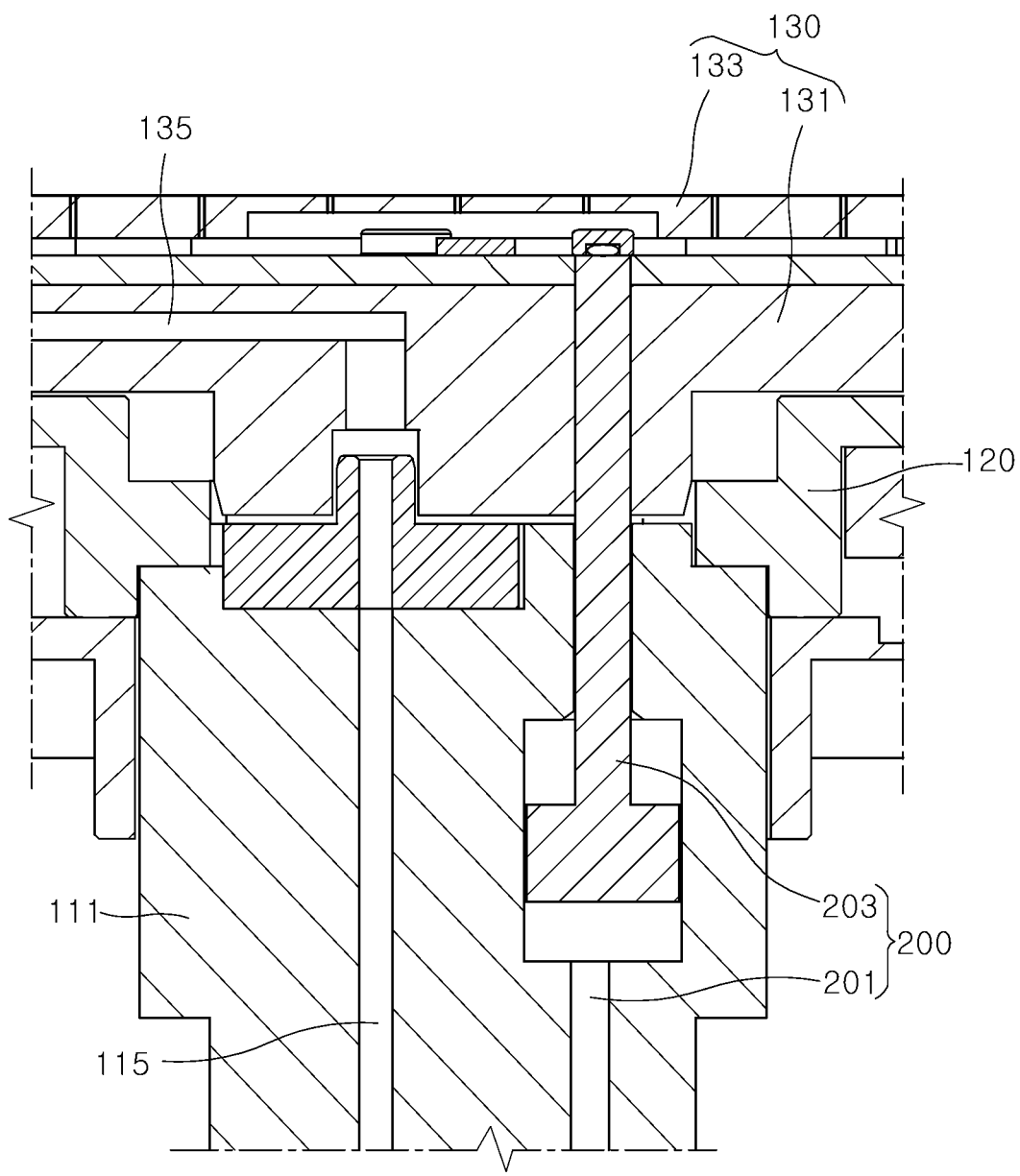
FIG. 9 is a schematic cross-sectional view illustrating an example of the moving module in the wafer processing apparatus according to the first embodiment of the present invention.
Figure 10:
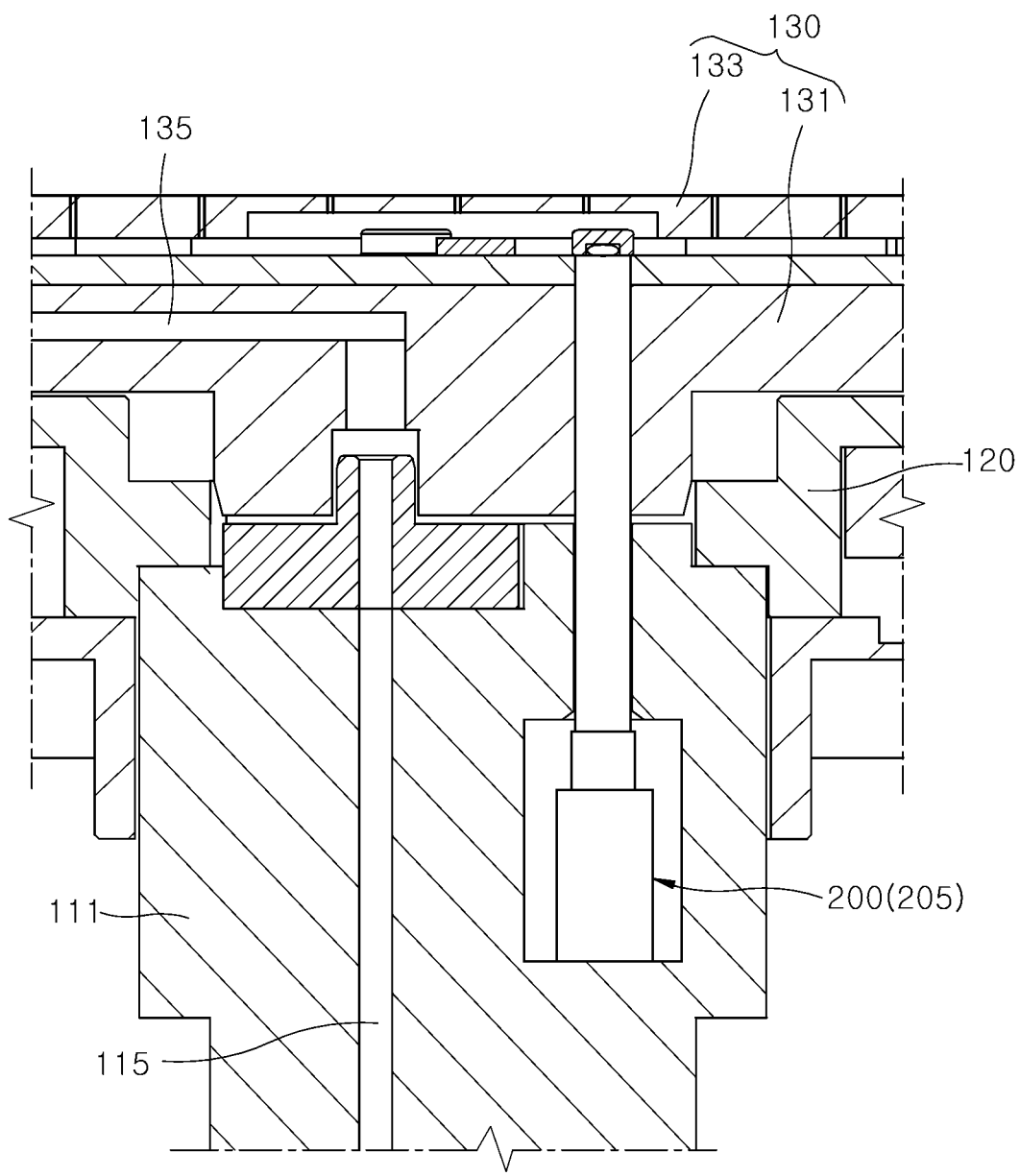
FIG. 10 is a schematic cross-sectional view illustrating another example of the moving module in the wafer processing apparatus according to the first embodiment of the present invention.
Figure 11:
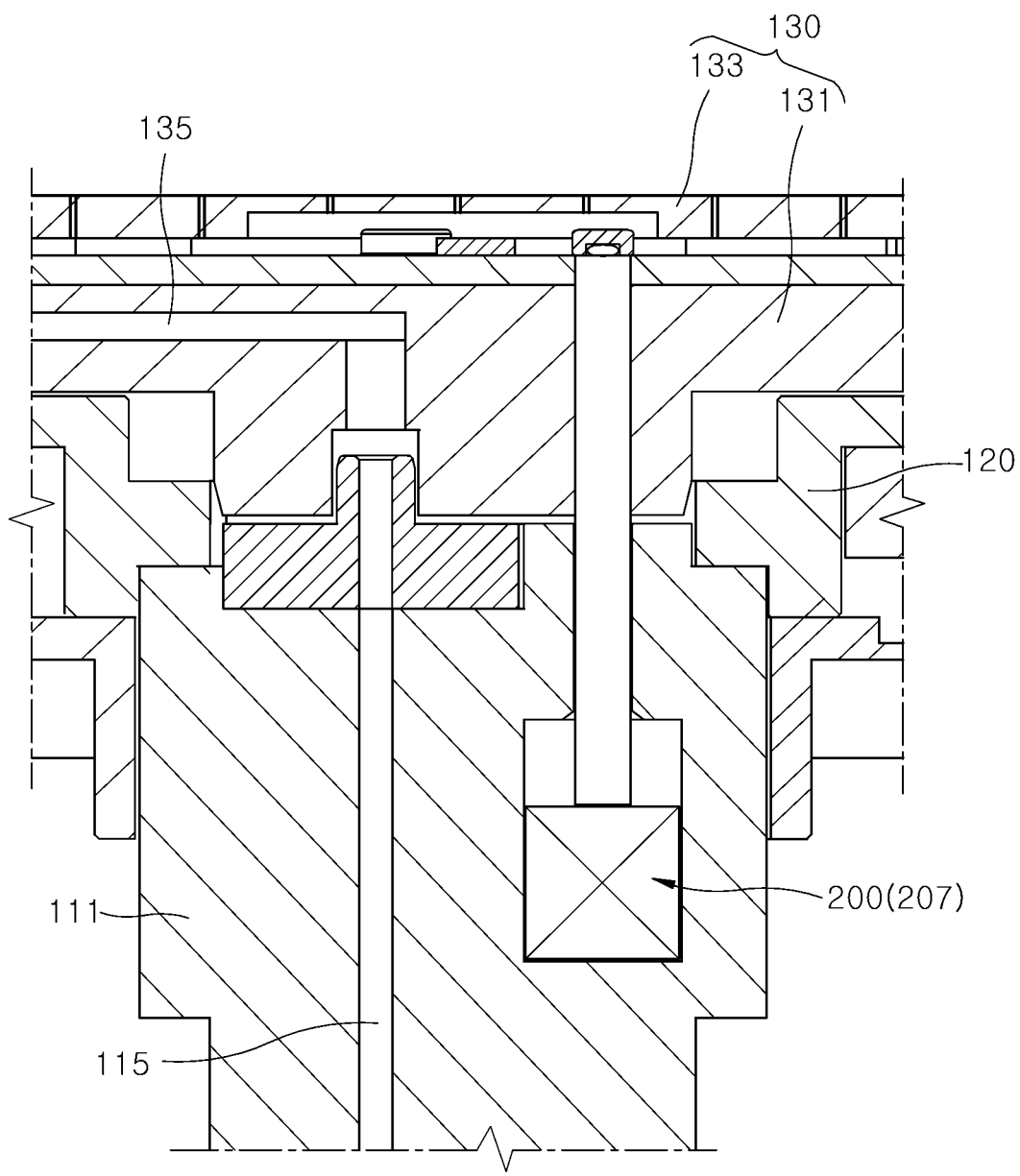
FIG. 11 is a schematic cross-sectional view illustrating still another example of the moving module in the wafer processing apparatus according to the first embodiment of the present invention.

FIG. 7 is a schematic cross-sectional view illustrating the wafer processing apparatus according to the first embodiment of the present invention, FIG. 8 is a schematic cross-sectional view illustrating a state in which the vacuum chuck is raised to a predetermined height in the wafer processing apparatus according to the first embodiment of the present invention, FIG. 9 is a schematic cross-sectional view illustrating an example of the moving module in the wafer processing apparatus according to the first embodiment of the present invention, FIG. 10 is a schematic cross-sectional view illustrating another example of the moving module in the wafer processing apparatus according to the first embodiment of the present invention, and FIG. 11 is a schematic cross-sectional view illustrating still another example of the moving module in the wafer processing apparatus according to the first embodiment of the present invention.

Referring to FIGS. 7 to 9, the moving module 200 includes a medium flow path 201 and a moving rod 203. The medium flow path 201 is formed to supply a moving medium supplied to the driver 110. The medium flow path 201 may be disposed inside the rotating shaft 111 in the lengthwise direction of the rotating shaft 111. The moving medium may be air or gas. The moving rod 203 is installed to be raised or lowered due to a pressure of the moving medium and is installed to be in contact with a lower portion of the vacuum chuck 130. A restoring spring may be installed in the moving rod 203 to restore the moving medium to its original position when the pressure of the moving medium is released. The moving rod 203 and the medium flow path 201 may be installed as a plurality of moving rods 203 and a plurality of medium flow paths 201 in a circumferential direction of the rotating shaft 111. When the plurality of moving rods 203 raise or lower the vacuum chuck 130, the vacuum chuck 130 may be raised or lowered while being maintained in a horizontal state.

Referring to FIG. 10, the moving module 200 may include a cylinder 205 for moving the vacuum chuck 130 or the chuck module 150. The cylinder 205 may be installed in the rotating chuck 120 to raise or lower the vacuum chuck 130 or installed in the rotating chuck 120 to move the chuck module 150. Since the cylinder 205 is driven as a fluid is supplied to or discharged from the cylinder 205, the vacuum chuck 130 or the chuck module 150 may be moved. When the solenoid 207 is applied as the moving module 200, since there is no need to install a separate medium flow path 201 in the driver 110, the driver 110 may be formed to have a simplified structure.

Referring to FIG. 11, the moving module 200 may include a solenoid 207 for moving the vacuum chuck 130 or the chuck module 150. The solenoid 207 may be installed in the rotating chuck 120 to raise or lower the vacuum chuck 130 or installed in the rotating chuck 120 to move the chuck module 150. Since the solenoid 207 is driven as power is supplied to or blocked from the solenoid 207, the vacuum chuck 130 or the chuck module 150 may be moved. When the solenoid 207 is applied as the moving module 200, since there is no need to install a separate medium flow path 201 in the driver 110, the driver 110 may be formed to have a simplified structure.

Various types of modules may be applied as the moving module 200, and a form in which the moving module 200 raises and lowers the vacuum chuck 130 will be described in more detail below.

Figure 12:
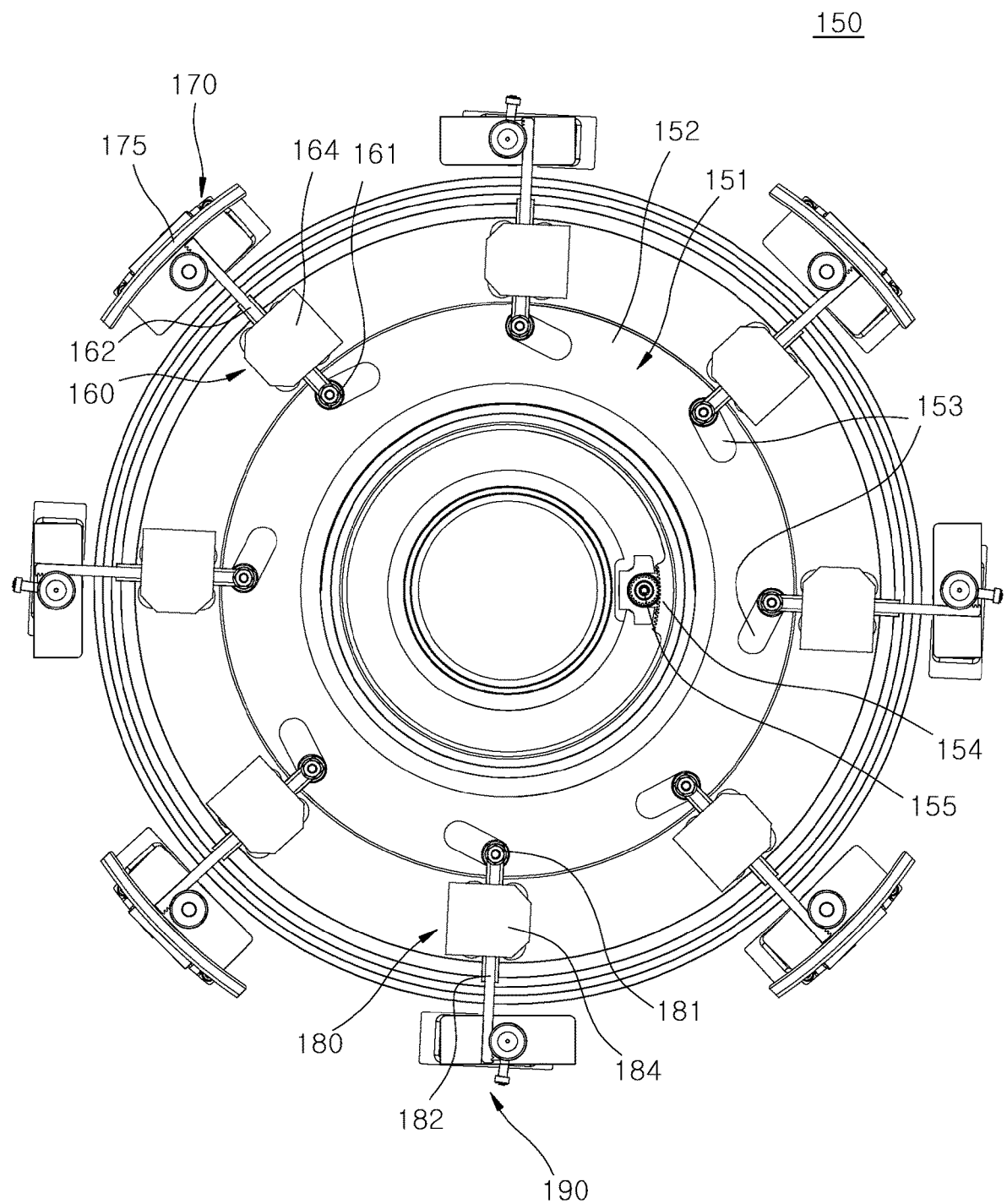
FIG. 12 is a schematic plan view illustrating a chuck module in the wafer processing apparatus according to the first embodiment of the present invention.
Figure 13:
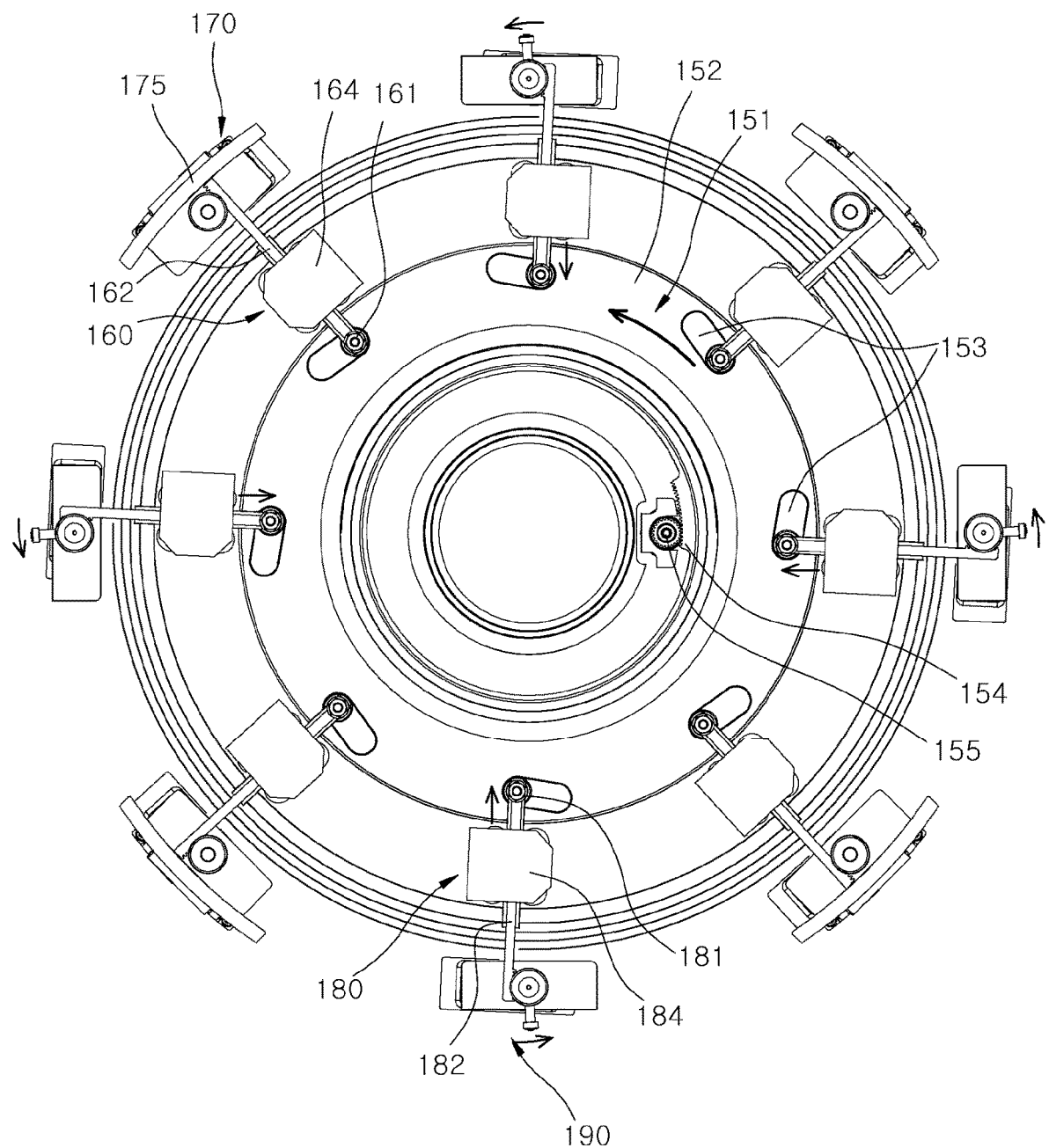
FIG. 13 is a schematic plan view illustrating a state in which a chuck base of the chuck module is rotated at a predetermined angle in the wafer processing apparatus according to the first embodiment of the present invention.
Figure 14:
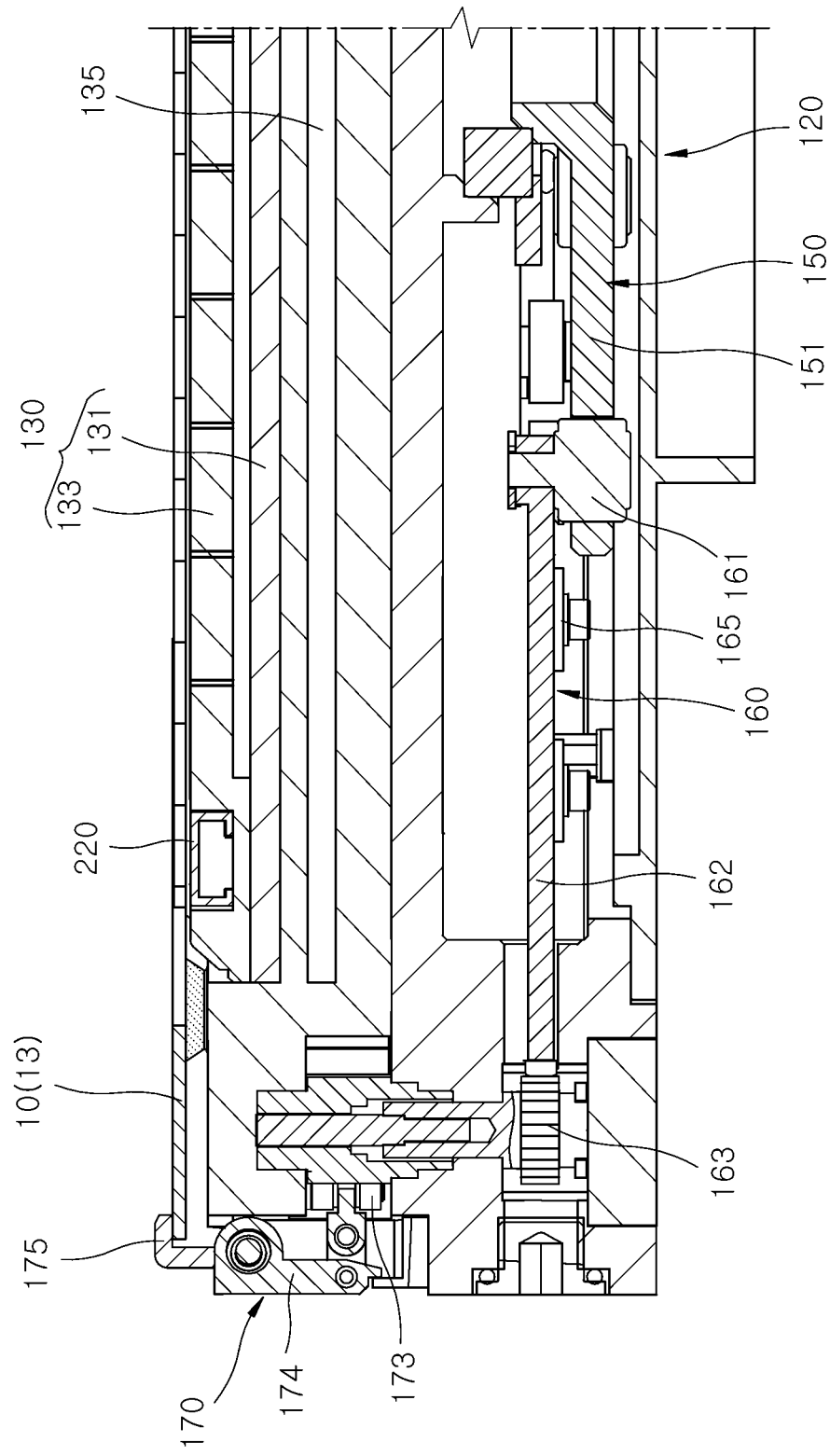
FIG. 14 is a schematic side view illustrating a state in which the chuck link and a wafer confining part of the chuck module are installed in a rotating chuck in the wafer processing apparatus according to the first embodiment of the present invention.
Figure 15:
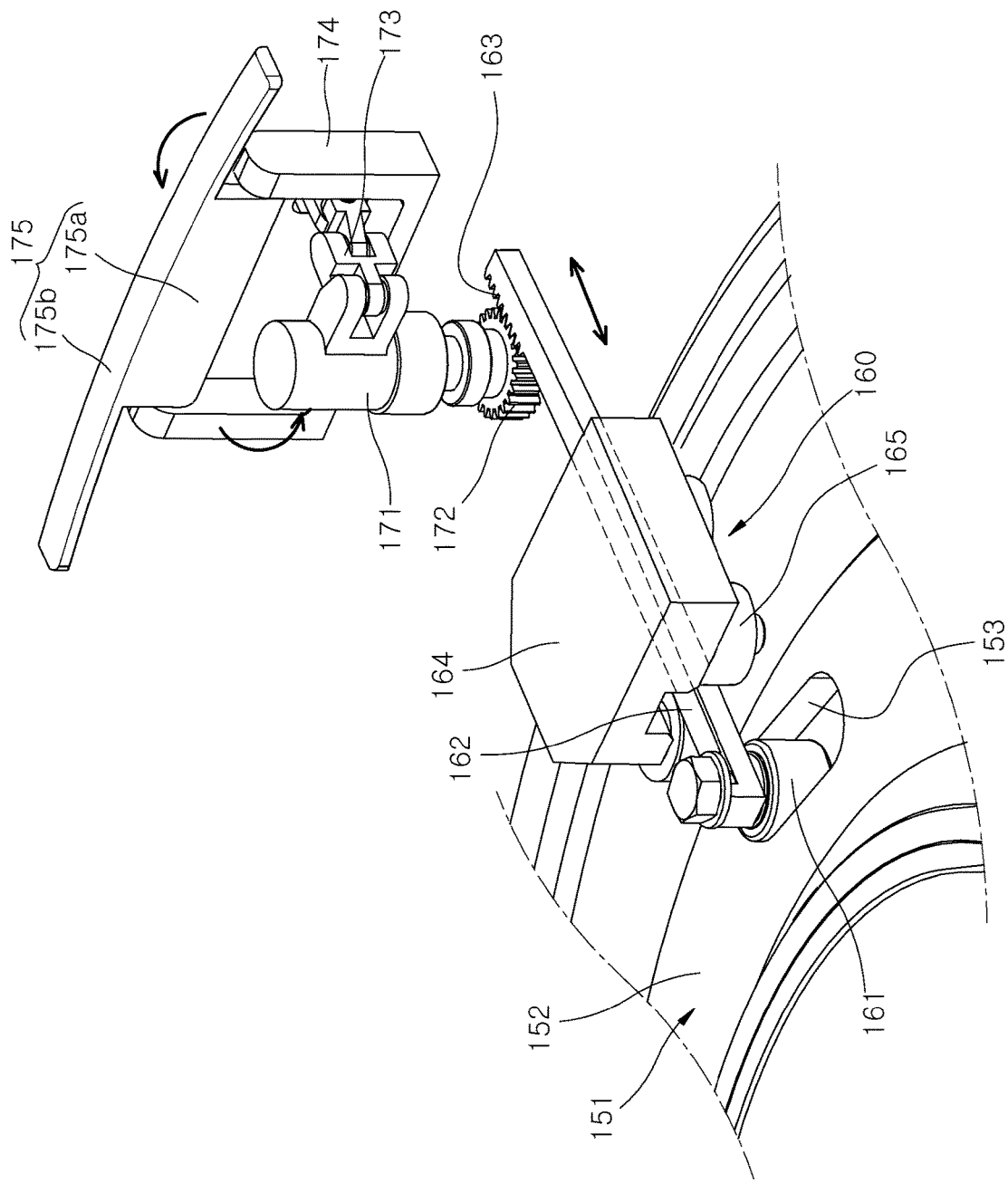
FIG. 15 is a schematic perspective view illustrating a first chuck link and the wafer confining part of the chuck module in the wafer processing apparatus according to the first embodiment of the present invention.

FIG. 12 is a schematic plan view illustrating the chuck module in the wafer processing apparatus according to the first embodiment of the present invention, FIG. 13 is a schematic plan view illustrating a state in which a chuck base of the chuck module is rotated at a predetermined angle in the wafer processing apparatus according to the first embodiment of the present invention, FIG. 14 is a schematic side view illustrating a state in which the chuck link and a wafer confining part of the chuck module are installed in a rotating chuck in the wafer processing apparatus according to the first embodiment of the present invention, and FIG. 15 is a schematic perspective view illustrating a first chuck link and the wafer confining part of the chuck module in the wafer processing apparatus according to the first embodiment of the present invention, Referring to FIGS. 12 to 15, the vacuum chuck 130 includes a first vacuum chuck 131 and a second vacuum chuck 133. The first vacuum chuck 131 is installed on the rotating chuck 120 to be rotated together therewith and forms a vacuum pressure to suction the wafer 10. The second vacuum chuck 133 is mounted on the first vacuum chuck 131, the wafer 10 is mounted on the second vacuum chuck 133, and the second vacuum chuck 133 is installed to be raised or lowered by the moving module 200, thereby increasing the gaps between the dies 11. The entirety of each of the first vacuum chuck 131 and the second vacuum chuck 133 may be formed in the form of a circular plate.

The medium flow path 201 is formed in the rotating shaft 111 to supply air to the first vacuum chuck 131. The medium flow path 201 may be formed inside the rotating shaft 111 in the lengthwise direction of the rotating shaft 111. A plurality of suction holes (not shown) communicating with the medium flow path 201 of the first vacuum chuck 131 are formed in the second vacuum chuck 133 to suction the wafer 10. The plurality of suction holes may be disposed in the form of a concentric circle in a circumferential direction of the second vacuum chuck 133. When a vacuum pressure is formed in the medium flow path 201, since the wafer 10 is pressed against an upper surface of the second vacuum chuck 133 due to a vacuum suction force of the suction holes, flatness of the wafer 10 may be maintained while the etching or cleaning process of the wafer 10 is performed in the wafer processing apparatus.

The chuck module 150 includes a chuck base 151, a chuck rotating part 155, a plurality of first chuck links 160, and a plurality of wafer confining parts 170.

The chuck base 151 is installed on the rotating chuck 120. The chuck rotating part 155 is connected to the chuck base 151 to rotate the chuck base 151. The plurality of first chuck links 160 are each radially connected to the chuck base 151 and are moved when the chuck base 151 is rotated. The plurality of wafer confining parts 170 are connected to the first chuck links 160 to fix the retainer ring 13 on the wafer 10 to the vacuum chuck 130 when the first chuck links 160 are moved. The chuck base 151 is installed to be concentric with the rotating chuck 120. The chuck base 151, the chuck rotating part 155, and the first chuck links 160 are disposed inside the rotating chuck 120, and the wafer confining parts 170 are disposed in circumferential portions of the rotating chuck 120 and the vacuum chuck 130. When the chuck rotating part 155 is driven, since the chuck base 151 is rotated at a predetermined angle, the plurality of first chuck links 160 are moved in a radial direction of the chuck base 151. Since the plurality of first chuck links 160 are simultaneously moved, the plurality of wafer confining parts 170 press and fix the retainer ring 13 on the wafer 10 to a circumferential portion of the first vacuum chuck 131. Since the plurality of first chuck links 160 and the plurality of wafer confining part 170 are simultaneously driven as the chuck base 151 is rotated, the wafer 10 may be confined to the vacuum chuck 130 using one chuck rotating part 155. Accordingly, the number of chuck rotating parts 155 installed in the chuck module 150 may be reduced.

The chuck base 151 includes a base body 152, a plurality of guides 153, and a base gear 154.

The base body 152 is formed in an annular shape to be concentric with the rotating shaft 111 of the rotating chuck 120. The base body 152 is disposed inside the rotating chuck 120. The plurality of guides 153 are formed in the base body 152 to allow the first chuck link 160 to be movably coupled. The number of the plurality of guides 153 is twice the number of the first chuck links 160, and the plurality of guides 153 are formed at equal intervals in a circumferential direction of the base body 152. The first chuck links 160 are alternately coupled to the plurality of guides 153. The base gear 154 is formed on the base body 152 and connected to the chuck rotating part 155. The base gear 154 is disposed on an inner circumferential surface of the base body 152 in the form of an arc. As the chuck rotating part 155 is driven, the base gear 154 is rotated, and as the base body 152 is rotated together with the base gear 154, the first chuck link 160 is moved in a radial direction of the base body 152.

The guide 153 is formed to be inclined with respect to a radius of the base body 152. The guide 153 may be a guide hole. The guide 153 may be a guide groove or a guide protrusion. Since the guide 153 is formed to be inclined with respect to the radius of the base body 152, as the base body 152 is rotated at a predetermined angle, the first chuck link 160 is linearly moved in the radial direction of the base body 152.

The first chuck link 160 includes a first guide slider 161, a first link member 162, and a first link gear 163. The first guide slider 161 is movably coupled to the guide 153. The first link member 162 is connected to the first guide slider 161 and is linearly moved in the radial direction of the base body 152 when the first guide slider 161 is moved. The first link member 162 is formed in the form of a linear bar. The first link gear 163 is formed on the first link member 162 to be engaged and moved with the wafer confining part 170. The first link gear 163 is formed in the form of a rack gear parallel to a lengthwise direction of the first link member 162.

The first chuck link 160 further includes a first guide block 164 which is coupled to the first link member 162 to be linearly movable. When the base body 152 is rotated, the first guide block 164 prevents the first link member 162 from being rotated in the circumferential direction of the base body 152. A first guide roller 165 may be installed such that, when the first link member 162 is linearly moved, the first guide block 164 is to be in rolling contact with both sides of the first link member 162. Accordingly, when the base body 152 is rotated and when the first guide slider 161 is moved along the guide 153, the first link member 162 may be linearly moved without being rotated.

The wafer confining part 170 includes a gripper shaft 171 rotatably installed on the rotating chuck 120, a gripper gear 172 formed on the gripper shaft 171 to be engaged with the first link gear 163, a gripper link 173 connected to the gripper shaft 171, a gripper supporter 174 fixed to the rotating chuck 120, and a press gripper 175 rotatably installed on the gripper supporter 174 and rotated to press or release the retainer ring 13 on the wafer 10 when the gripper link 173 is moved. The gripper shaft 171 is disposed perpendicular to the lengthwise direction of the first link member 162. The gripper gear 172 is formed in the form of a pinion gear. The gripper link 173 connects the gripper shaft 171 to the gripper supporter 174 through a plurality of links (not shown). The press gripper 175 is formed in an arc shape to press and fix the retainer ring 13 on the wafer 10 in the circumferential direction.

The press gripper 175 is hinge-coupled to the gripper supporter 174 and includes a gripper turning part 175a connected to the gripper link 173, and a press finger 175b formed on the gripper turning part 175a to press or release the retainer ring 13 on the wafer 10. When the first chuck link 160 is linearly moved and when the gripper gear 172 is rotated by being engaged with the first link gear 163, the gripper turning part 175a is rotated on the gripper supporter 174. As the gripper turning part 175a is turned, the press finger 175b presses or releases the retainer ring 13 on the wafer 10.

Figure 16:
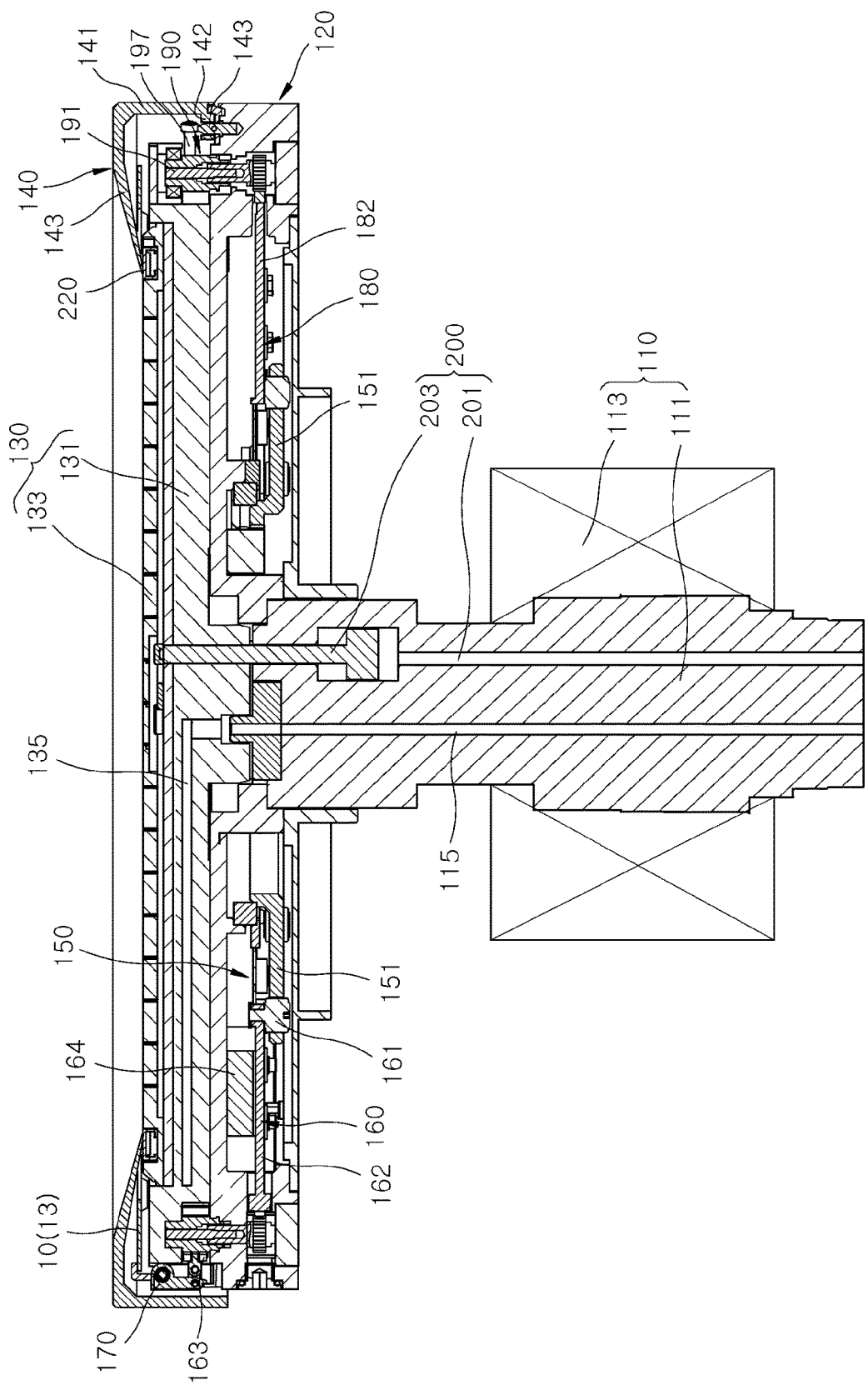
FIG. 16 is a schematic cross-sectional view illustrating a state in which a ring cover is installed in circumferential portions of the rotating chuck and the vacuum chuck in the wafer processing apparatus according to the first embodiment of the present invention.
Figure 17:
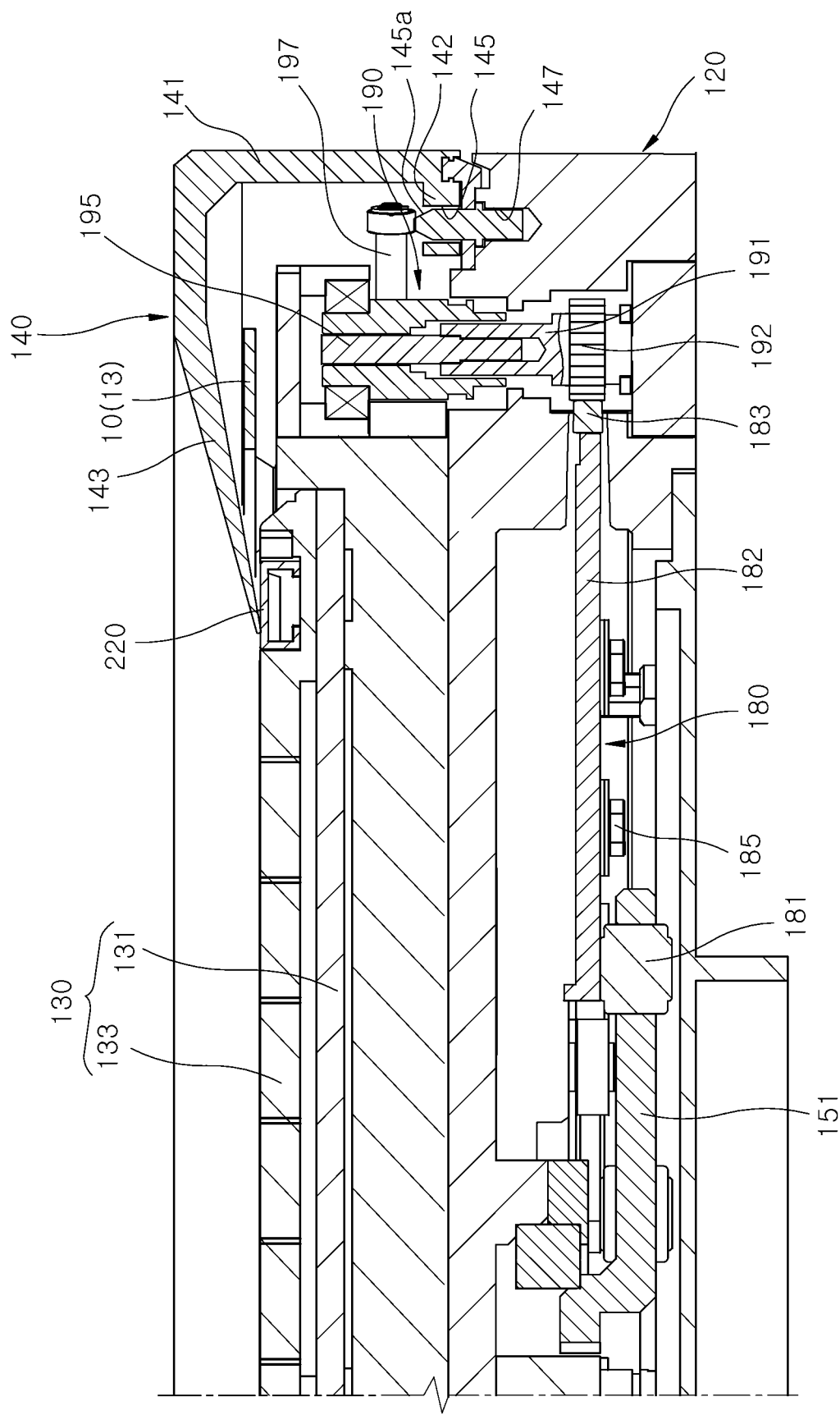
FIG. 17 is a schematic cross-sectional view illustrating a state in which a second chuck link and a cover confining part are installed in the rotating chuck in the wafer processing apparatus according to the first embodiment of the present invention.
Figure 18:
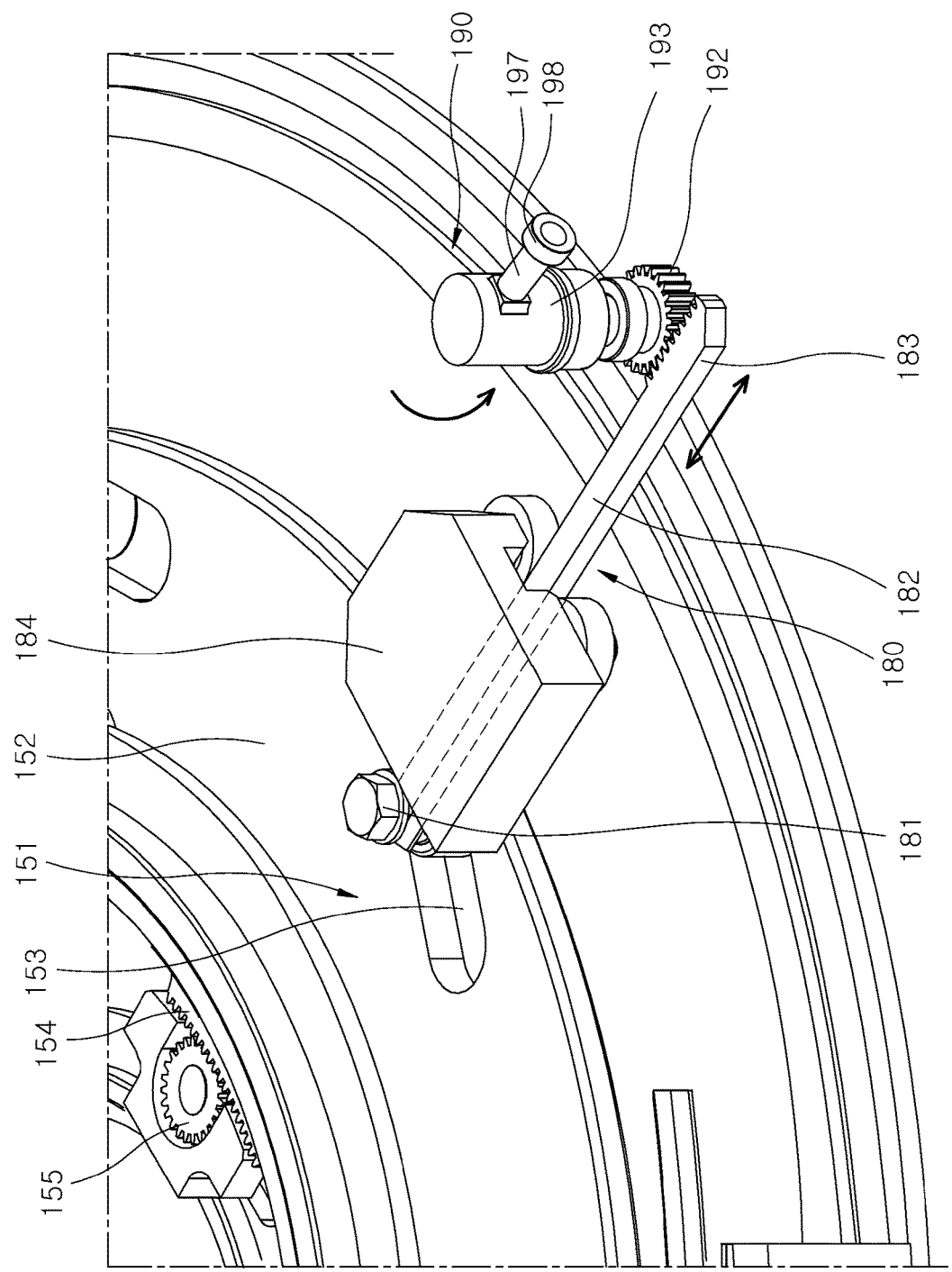
FIG. 18 is a schematic perspective view illustrating a state in which a second chuck link and the cover confining part are installed in the wafer processing apparatus according to the first embodiment of the present invention.
Figure 19:
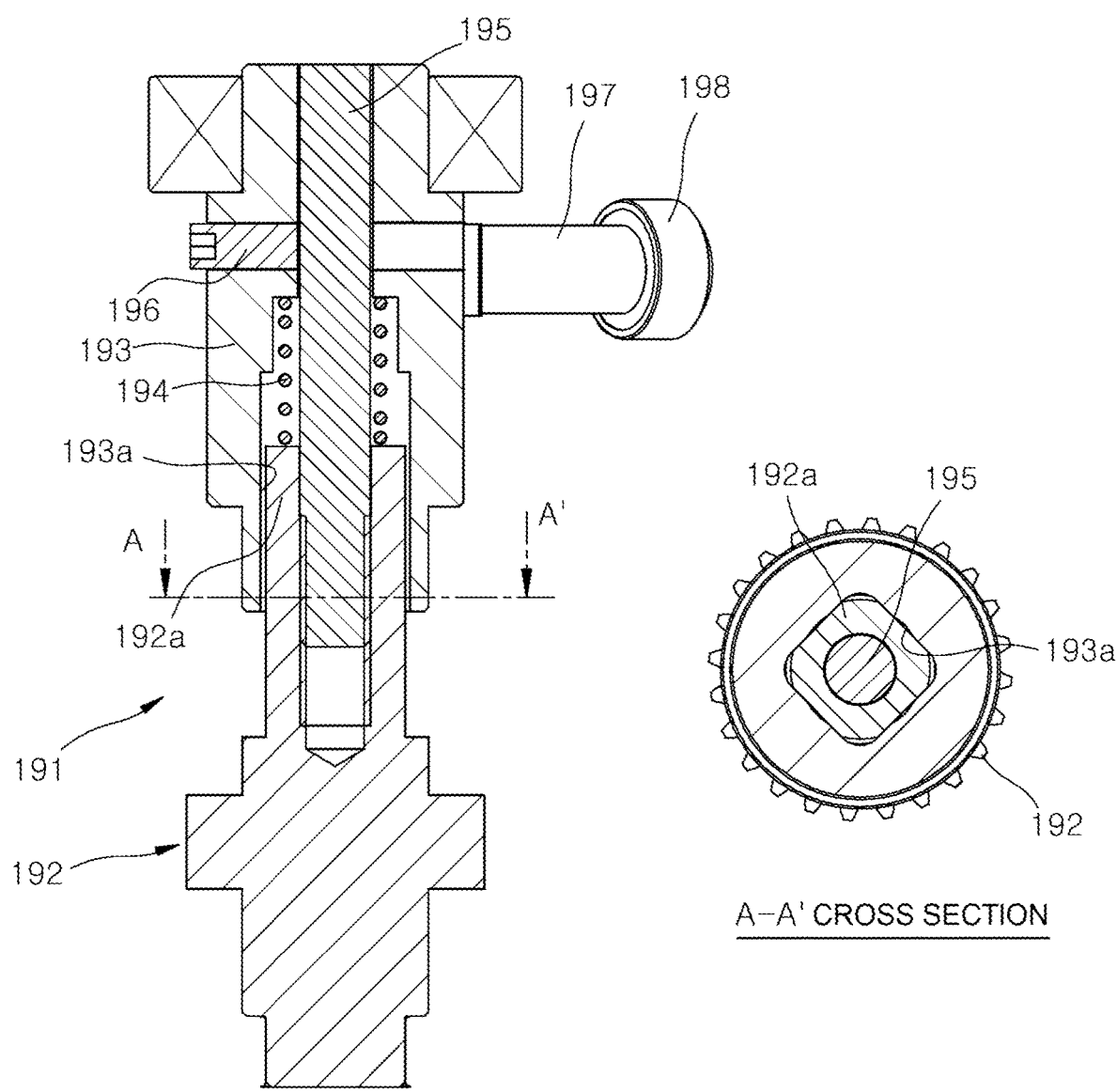
FIG. 19 is a schematic cross-sectional view illustrating the cover confining part in the wafer processing apparatus according to the first embodiment of the present invention.

FIG. 16 is a schematic cross-sectional view illustrating a state in which a ring cover is installed in circumferential portions of the rotating chuck and the vacuum chuck in the wafer processing apparatus according to the first embodiment of the present invention, FIG. 17 is a schematic cross-sectional view illustrating a state in which a second chuck link and a cover confining part are installed in the rotating chuck in the wafer processing apparatus according to the first embodiment of the present invention, FIG. 18 is a schematic perspective view illustrating a state in which a second chuck link and the cover confining part are installed in the wafer processing apparatus according to the first embodiment of the present invention, and FIG. 19 is a schematic cross-sectional view illustrating the cover confining part in the wafer processing apparatus according to the first embodiment of the present invention.

Referring to FIGS. 16 to 19, the wafer processing apparatus further includes the ring cover 140 which is disposed on a circumferential portion of the vacuum chuck 130 to press the adhesive sheet 12 on the wafer 10 and seal the circumferential portion side of the vacuum chuck 130 and which is fixed to the rotating chuck 120 by the chuck module 150. Since the ring cover 140 is formed in the form of a circular ring to press the adhesive sheet 12 on the wafer 10 and seal the circumferential portion of the vacuum chuck 130, it is possible to minimize the adhesive sheet 12 being damaged due to the etching solution and prevent the rotating chuck 120 and the vacuum chuck 130 from being contaminated or damaged due to the etching solution.

The ring cover 140 includes a cover body 141 formed to surround a circumference of the vacuum chuck 130, a confining bump 142 formed to protrude inward from a lower side of the cover body 141, and a cover pressing part 143 extending inward from an upper side of the cover body 141 and pressing the adhesive sheet 12 on the wafer 10. The cover pressing part 143 is formed to press a portion of the adhesive sheet 12 spaced about 1 mm from the outermost portion of the die 11. A thickness of the cover pressing part 143 may be formed to gradually become smaller in a direction toward an end portion of the cover pressing part 143. Since the portion of the adhesive sheet 12 between the retainer ring 13 and the die 11 is sealed by the cover pressing part 143 excluding a width of about 1 mm, it is possible to minimize the adhesive sheet 12 being damaged due to the etching solution.

The cover pressing part 143 further includes the engagement pin 145 installed to protrude from the circumferential portion of the rotating chuck 120, and the engagement groove 147 is formed in the circumferential portion of the ring cover 140 to allow the engagement pin 145 to be inserted into the engagement groove 147. Therefore, when the ring cover 140 is installed in the circumferential portion of the rotating chuck 120, the engagement groove 147 of the ring cover 140 is inserted into the engagement pin 145 so that an installation position of the ring cover 140 may be accurately aligned.

The chuck module 150 includes a plurality of second chuck links 180 and a plurality of cover confining parts 190.

The plurality of second chuck links 180 are each radially connected to the chuck base 151 and are moved when the chuck base 151 is rotated. The plurality of cover confining parts 190 are connected to the second chuck links 180 to fix the ring cover 140 to the rotating chuck 120 when the second chuck links 180 are moved. As the chuck rotating part 155 is driven, the base gear 154 is rotated, and as the base body 152 is rotated together with the base gear 154, the second chuck link 180 is moved in the radial direction of the base body 152. In this case, when the base body 152 of the chuck base 151 is rotated, the plurality of first chuck links 160 and the plurality of second chuck links 180 are moved simultaneously. As the first chuck link 160 is moved, the retainer ring 13 on the wafer 10 is fixed to the vacuum chuck 130, and as the second chuck link 180 is moved, the ring cover 140 is fixed to the rotating chuck 120. Therefore, since the wafer 10 and the ring cover 140 are simultaneously fixed to the vacuum chuck 130 and the rotating chuck 120 using one chuck base 151 and one chuck rotating part 155, a structure of the wafer processing apparatus may be simplified.

The second chuck link 180 includes a second guide slider 181, a second link member 182, and a second link gear 183.

The second guide slider 181 is movably coupled to the guide 153. The second link member 182 is connected to the second guide slider 181 and is linearly moved in the radial direction of the base body 152 when the second guide slider 181 is moved. The second link gear 183 is formed on the second link member 182 to be engaged and moved with the cover confining part 190. The second link member 182 is formed in the form of a linear bar. The second link gear 183 is formed in the form of a rack gear parallel to a lengthwise direction of the second link member 182.

The second chuck link 180 further includes a second guide block 184 which is coupled to the second link member 182 to be linearly movable. When the base body 152 is rotated, the second guide block 184 prevents the second chuck link 180 from being rotated in the circumferential direction of the base body 152. A second guide roller 185 is installed in second guide block 184 such that, when the second link member 182 is linearly moved, the second guide roller 185 is to be in rolling contact with both sides of the second link member 182. Accordingly, when the base body 152 is rotated and when the second guide slider 181 is moved along the guide 153, the second link member 182 may be linearly moved without being rotated.

The cover confining part 190 includes a cover confining shaft 191 rotatably installed in the rotating chuck 120, a confining gear 192 formed on the cover confining shaft 191 to be engaged with the second link gear 183, a cover confining bar 197 connected to the cover confining shaft 191 to press or release the ring cover 140, and a confining roller 198 rotatably installed on the cover confining bar 197 to be in rolling contact with the ring cover 140.

As the second link member 182 is linearly moved, the second link gear 183 and the confining gear 192 are engaged and driven. As the confining gear 192 is rotated, the cover confining shaft 191 and the cover confining bar 197 are rotated, and the confining roller 198 is in rolling contact with the confining bump 142 of the ring cover 140 to be moved. Therefore, since the confining roller 198 is in rolling contact with the confining bump 142 of the ring cover 140, it is possible to prevent foreign materials from being generated due to abrasion or a scrape of the confining bump 142 of the ring cover 140. Therefore, the foreign materials are suppressed from being introduced to the wafer 10 located inside the ring cover 140 so that it is possible to reduce a defective rate in the wafer 10.

The cover confining shaft 191 includes a confining gear 192 formed to be engaged with the second link gear 183, a shaft coupler 193 axis-coupled to the confining gear 192, an elastic member 194 interposed between the shaft coupler 193 and the confining gear 192, and a height adjuster 195 screw-coupled to the shaft coupler 193 and the confining gear 192 to adjust a height of the shaft coupler 193. The confining gear 192 and the shaft coupler 193 are installed coaxially. A coil spring may be applied as the elastic member 194. A height adjustment bolt with a screw thread formed on an outer surface thereof may be applied as the height adjuster 195, and a screw thread may be formed inside the confining gear 192 to allow the height adjuster 195 to be screw-coupled to the screw thread.

Since the elastic member 194 is interposed between the shaft coupler 193 and the confining gear 192, it is possible to prevent a clearance noise from being generated due to an assembly tolerance between the shaft coupler 193 and the confining gear 192. In addition, since the height adjuster 195 is screw-coupled to the shaft coupler 193 and the confining gear 192, when the ring cover 140 is assembled, a height of the shaft coupler 193 may be adjusted to prevent assembly tolerances from occurring.

A polygonal rotation prevention part 192a may be formed in a central portion of the confining gear 192, and a polygonal rotation prevention groove 193a may be formed inside the shaft coupler 193 to allow the rotation prevention part 192a to be fitted in the shaft coupler 193. Since the rotation prevention part 192a and the rotation prevention groove 193a are formed in a polygonal shape, it is possible to reduce assembly errors in an axial direction and a rotation direction of the confining gear 192 and the shaft coupler 193. In addition, the assembly errors may be further reduced by increasing surface roughness of the rotation prevention part 192a and the rotation prevention groove 193a.

The cover confining shaft 191 further includes a position fixing part 196 which is screw-coupled to an outer side of the shaft coupler 193 to confine the height adjuster 195 to the shaft coupler 193. After the height adjuster 195 is screw-coupled to the shaft coupler 193 to adjust the height of the shaft coupler 193, as the position fixing part 196 is screw-coupled to the shaft coupler 193 to press the height adjuster 195, the height adjuster 195 is fixed in position. Therefore, it is possible to prevent the height of the shaft coupler 193 from being varied due to the position fixing part 196.

The cover pressing part 143 further includes the engagement pin 145 installed to protrude from the circumferential portion of the rotating chuck 120, and the engagement groove 147 is formed in the circumferential portion of the ring cover 140 to allow the engagement pin 145 to be inserted into the engagement groove 147. A tapered portion 145a is formed on an upper side of the engagement pin 145 to guide insertion of the engagement groove 147. When the ring cover 140 is seated on the rotating chuck 120 and when the engagement pin 145 is inserted into the engagement groove 147, the ring cover 140 is guided to a correct installation position. Accordingly, installation convenience of the ring cover 140 can be improved. In addition, when the rotating chuck 120 is rotated, it is possible to prevent the ring cover 140 from slipping in the circumferential direction.

Figure 20:
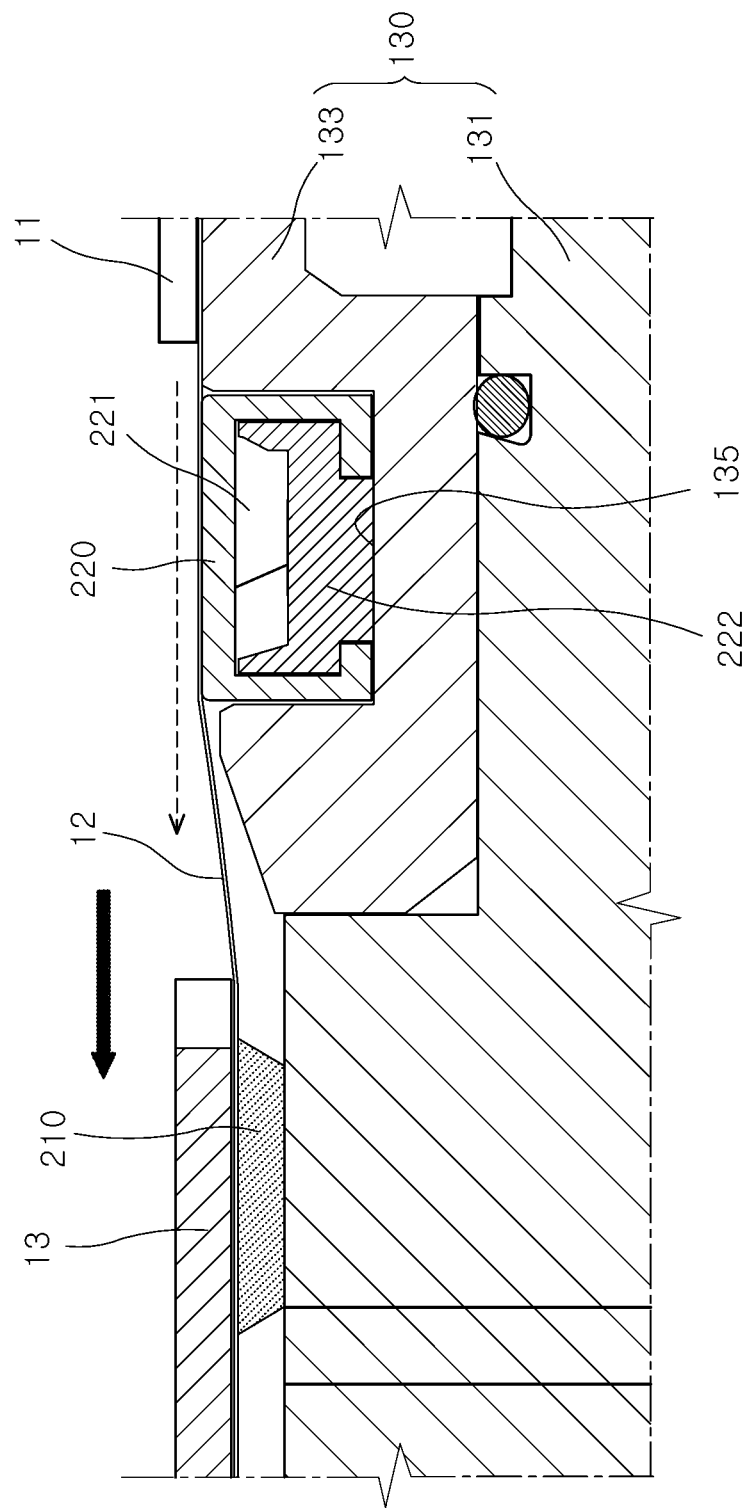
FIG. 20 is a schematic cross-sectional view illustrating a state in which an upper surface of a retainer ring is installed at a lower level than an upper surface of the die in the wafer processing apparatus according to the first embodiment of the present invention.
Figure 21:
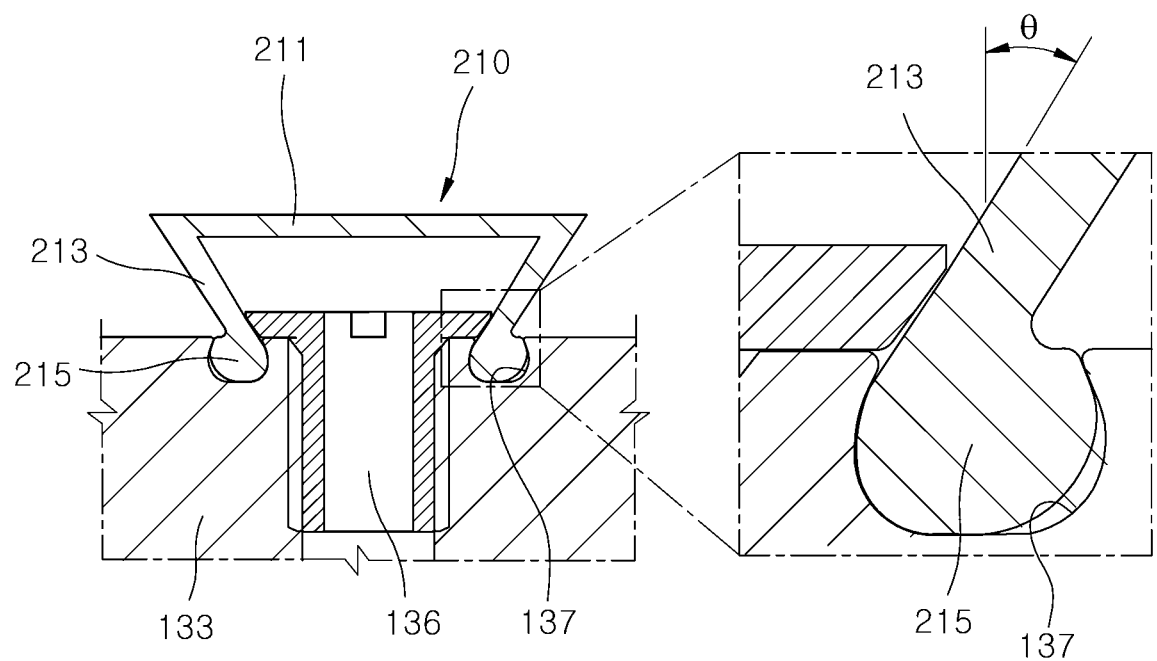
FIG. 21 is a schematic cross-sectional view illustrating a state in which a suction pad is installed in the vacuum chuck in the wafer processing apparatus according to the first embodiment of the present invention.

FIG. 20 is a schematic cross-sectional view illustrating a state in which an upper surface of the retainer ring is installed at a lower level than an upper surface of the vacuum chuck in the wafer processing apparatus according to the first embodiment of the present invention, and FIG. 21 is a schematic cross-sectional view illustrating a state in which a suction pad is installed in the vacuum chuck in the wafer processing apparatus according to the first embodiment of the present invention.

Referring to FIGS. 20 and 21, a height of the retainer ring 13 on the wafer 10 is formed to be smaller than or equal to a height of an upper surface of the vacuum chuck 130. Therefore, when the rotating chuck 120 rotates the wafer 10 and a treatment solution is sprayed onto the wafer 10, the treatment solution on the wafer 10 may be smoothly discharged due to a centrifugal force in the radial direction of the wafer 10. In addition, since the treatment solution discharged in the radial direction of the wafer 10 colliding with the retainer ring 13 to be reflected or rebound to a rotation center of the wafer 10 is prevented, it is possible to prevent stains from being generated on the surface of wafer 10 due to the rebounded treatment solution. Therefore, cleaning efficiency of the wafer 10 can be improved.

Figure 22:
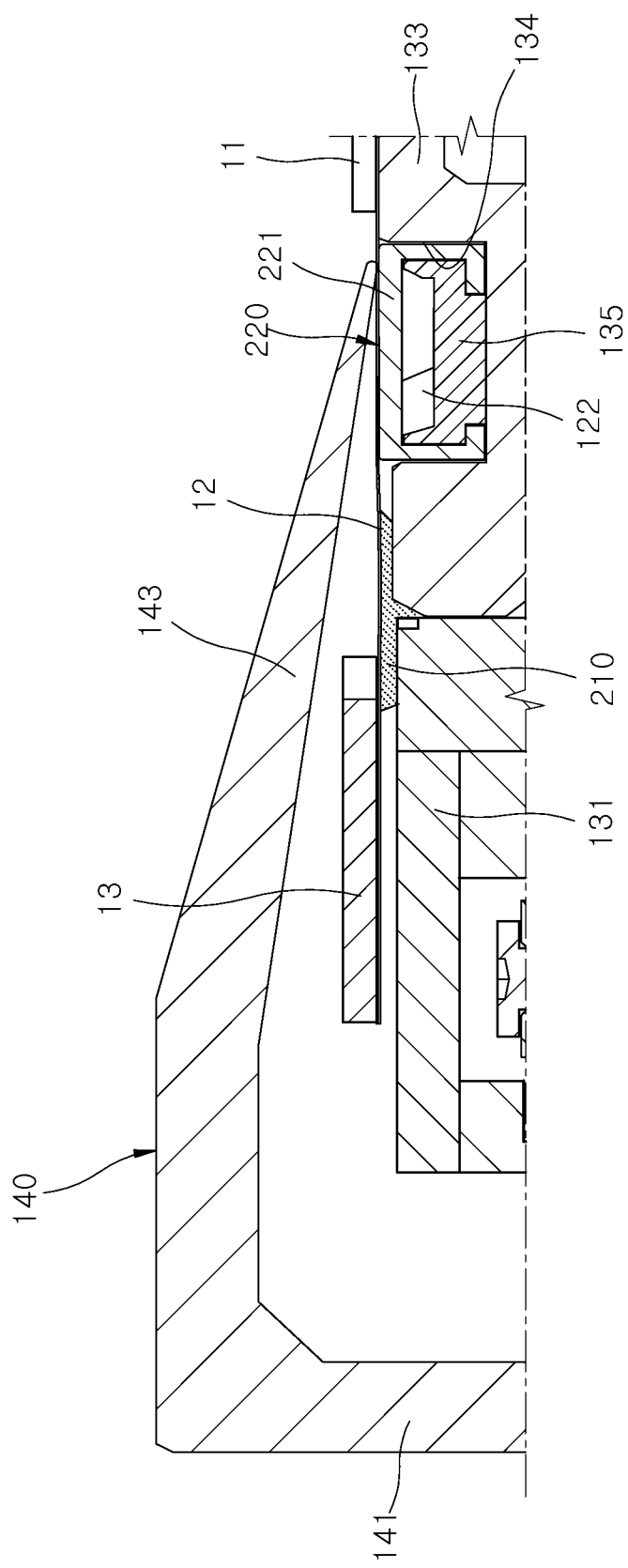
FIG. 22 is a schematic cross-sectional view illustrating a state in which the ring cover presses a sealing ring part in the wafer processing apparatus according to the first embodiment of the present invention.
Figure 23:
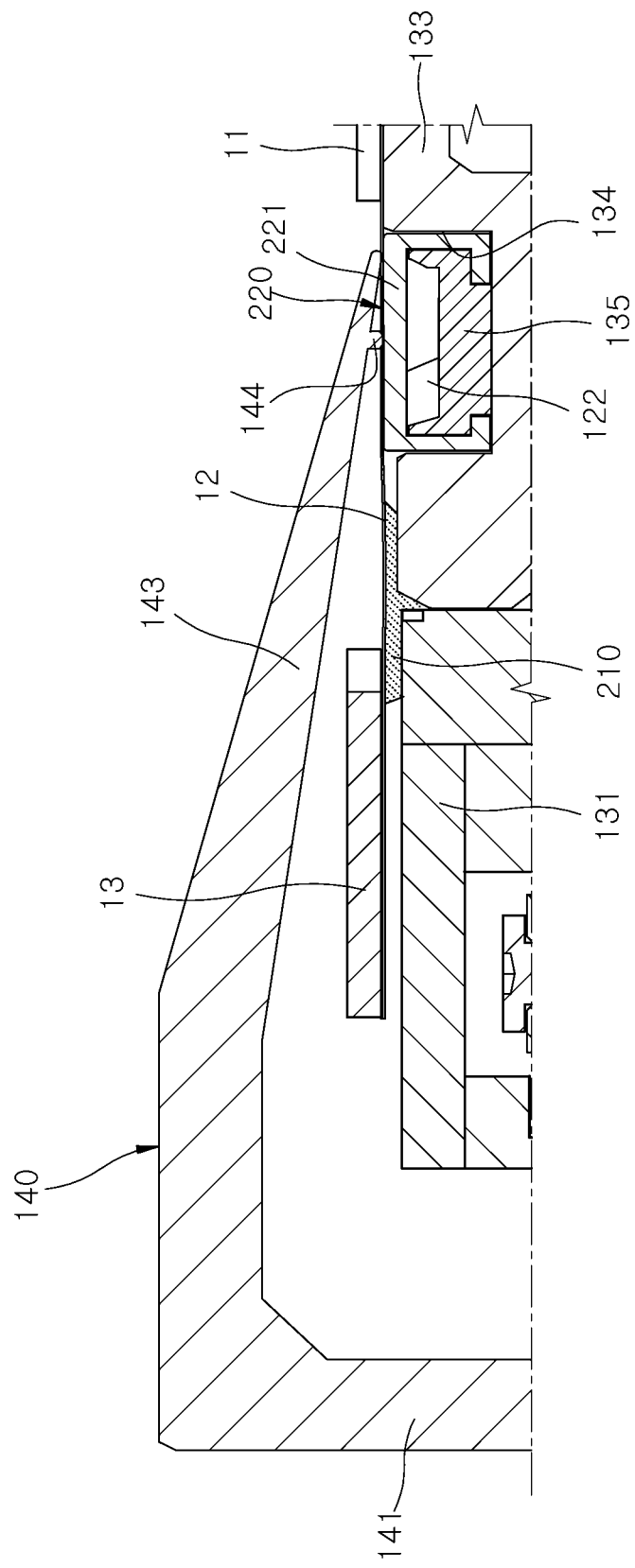
FIG. 23 is a schematic cross-sectional view illustrating another example of the ring cover in the wafer processing apparatus according to the first embodiment of the present invention.

The vacuum chuck 130 further includes a plurality of suction pads 210 installed in a vacuum port of the vacuum chuck 130 to suction the retainer ring 13 on the wafer 10 (see FIGS. 22 and 23). The plurality of suction pads 210 are disposed in the circumferential direction of the vacuum chuck 130. The plurality of suction pads 210 are disposed in a circumference the first vacuum chuck 131. The suction pad 210 is formed of a cushion material such as a rubber material or a urethane material. Since the suction pad 210 suctions the retainer ring 13 on the wafer 10 and fixes the retainer ring 13 to the vacuum chuck 130, when the vacuum chuck 130 is rotated, it is possible to prevent a position of the wafer 10 from being varied.

The suction pad 210 includes a suction body 211, a flatness management part 213, and a press-fitting fixing part 215.

The suction body 211 is disposed above the vacuum port 136 to suction the wafer 10. An upper surface of the suction body 211 is formed in the form of a flat plate to allow a lower surface of the wafer 10 to be seated on and pressed against the upper surface. The flatness management part 213 is formed to be inclined toward a central portion from a lower circumferential portion of the suction body 211 to allow the vacuum port 136 to be fitted in the flatness management part 213. An inclined surface of the flatness management part 213 adjacent to an inclined surface of the vacuum port 136 may be formed to be inclined while maintaining an interval of about 0.02 mm or less. An upper side of the flatness management part 213 serves as a contact reference surface of the retainer ring 13 on the wafer 10, and when the wafer 10 is suctioned, since the flatness management part 213 is contracted uniformly in the circumferential direction, it is possible to maintain flatness of the suction body 211 and attenuate a vibration. The press-fitting fixing part 215 is formed in the flatness management part 213 to be press-fitted in the fixing groove 137 of the vacuum chuck 130. The fixing groove 137 is formed to be recessed to surround the vacuum port 136, and the press-fitting fixing part 215 is formed to be thicker than the flatness management part 213 to be press-fitted in the fixing groove 137. The press-fitting fixing part 215 and the fixing groove 137 may each be formed in an annular shape.

FIG. 22 is a schematic cross-sectional view illustrating a state in which the ring cover presses a sealing ring part in the wafer processing apparatus according to the first embodiment of the present invention.

Referring to FIG. 22, the vacuum chuck 130 further includes a sealing ring 220 which is pressed against the adhesive sheet 12 on the wafer 10 and pressed by the ring cover 140. The sealing ring 220 is formed of a cushion material. In this case, the sealing ring 220 is formed in an annular shape along a circumference of the second vacuum chuck 133. When the retainer ring 13 on the wafer 10 is seated on the suction pad 210, a portion of the adhesive sheet 12 between the die 11 and the retainer ring 13 on the wafer 10 corresponds to the sealing ring 220. When the ring cover 140 is constrained by the cover confining part 190 of the chuck module 150, the ring cover 140 presses the adhesive sheet 12 and thus the adhesive sheet 12 is pressed against the sealing ring 220. Since the sealing ring 220 is elastically deformed due to a pressing force of the ring cover 140, the adhesive sheet 12 may be further compressed due to the pressing force of the ring cover 140 and a restoring force of the sealing ring 220. Therefore, it is possible to block an infiltration of the treatment solution between the ring cover 140 and the adhesive sheet 12.

A deformation space 221 is formed inside the sealing ring 220 to allow the sealing ring 220 to be deformed when the ring cover 140 presses. In this case, an allowance space 222 is formed in a circumferential portion of the second vacuum chuck 133 to allow the sealing ring 220 to be deformed, and a hook portion 135 is formed on an outer side of the allowance space 222 to allow both ends of the sealing ring 220 to be press-fitted. A depth of the deformation space 221 may be appropriately deformed in consideration of a pressing amount of the cover pressing part 143 of the ring cover 140. The deformation space 221 is formed along a circumference of the cover pressing part 143 of the ring cover 140. Since the hook portion 135 confines a lower side of the sealing ring 220, it is possible to prevent the sealing ring 220 from being separated from the second vacuum chuck 133.

FIG. 23 is a schematic cross-sectional view illustrating another example of the ring cover in the wafer processing apparatus according to the first embodiment of the present invention.

Referring to FIG. 23, a sealing protrusion 144 is formed on the ring cover 140 to be pressed against the sealing ring 220. The sealing protrusion 144 is formed along the circumference of the cover pressing part 143 of the ring cover 140. The sealing protrusion 144 is formed to be concentric with the cover pressing part 143 of the ring cover 140. The sealing protrusion 144 is formed at a location opposite to a central portion in a width direction of the sealing ring 220 or formed opposite around the central portion. Since the sealing ring 220 is formed along the circumference of the ring cover 140, the cover pressing part 143 and sealing protrusion 144 may doubly press the sealing ring 220. Therefore, since the portion of the adhesive sheet 12 between the outermost circumference of the die 11 and the retainer ring 13 in the wafer 10 is dually pressed against, sealing performance of the adhesive sheet 12 and the ring cover 140 can be improved. In addition, since the cover pressing part 143 of the ring cover 140 presses an inner edge of the sealing ring 220, and the sealing protrusion 144 presses a central portion of the sealing ring 220 or a periphery of the central portion thereof, an overlap amount between the ring cover 140 and the sealing ring 220 may be increased. Accordingly, it is possible to reduce a compression force of the ring cover 140 by as much as an increase in overlap amount of the ring cover 140, and it is possible to relatively lower precision or specification of a structure for increasing the compression force of the ring cover 140.

Figure 24:
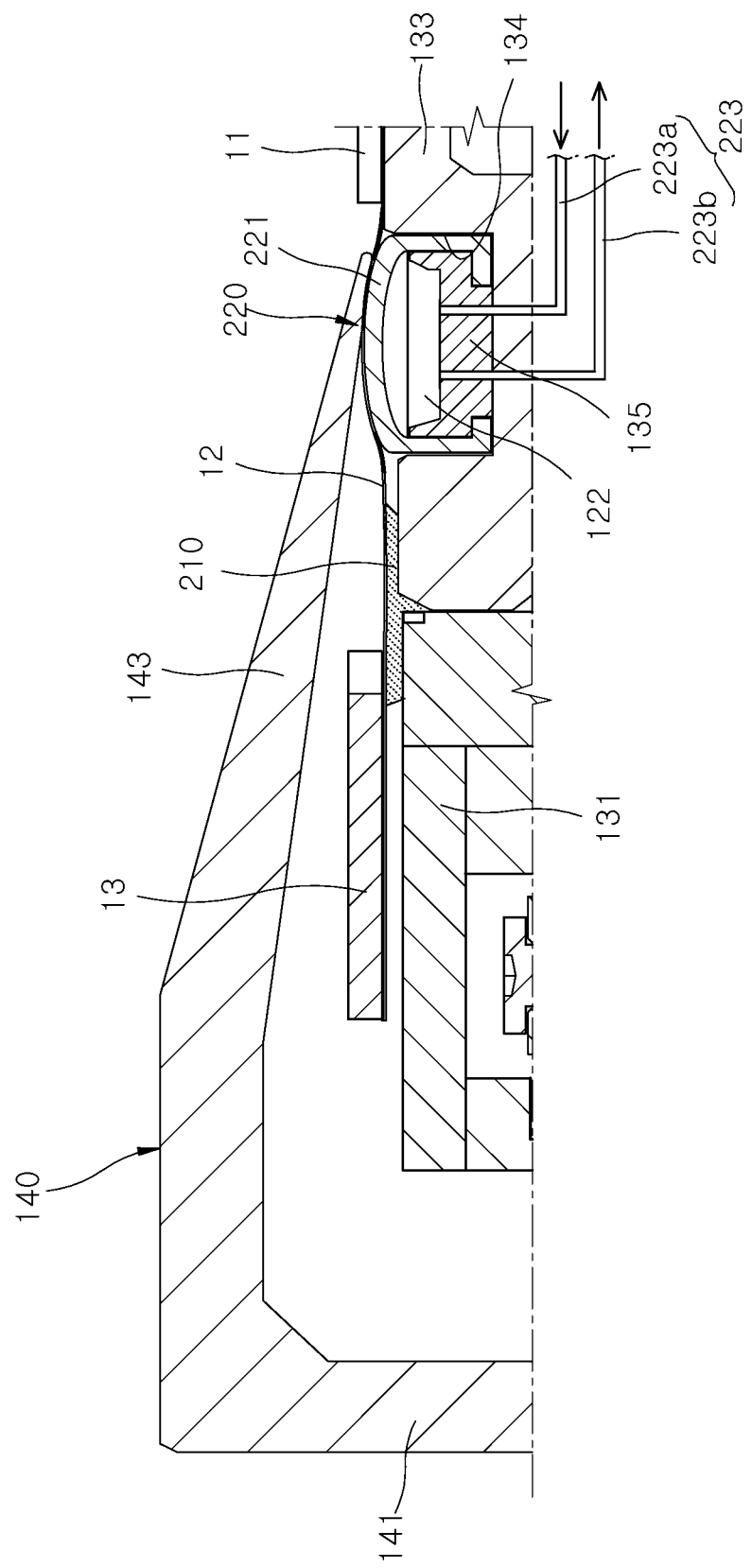
FIG. 24 is a schematic cross-sectional view illustrating a state in which a fluid supply part is connected to the sealing ring in the wafer processing apparatus according to the first embodiment of the present invention.

FIG. 24 is a schematic cross-sectional view illustrating a state in which a fluid supply part is connected to the sealing ring in the wafer processing apparatus according to the first embodiment of the present invention.

Referring to FIG. 24, the vacuum chuck 130 further includes a fluid supply part 223 connected to the sealing ring 220 to supply or discharge a fluid to or from the deformation space 221. A fluid such as air or nitrogen may be supplied to the deformation space 221. The fluid supply part 223 includes a fluid supply line 223a connected to the deformation space 221 to supply a fluid to the deformation space 221 and a fluid discharge line 223b connected to the deformation space 221 to discharge a fluid from the deformation space 221. When the fluid supply part 223 supplies a fluid to the deformation space 221 in a state in which the ring cover 140 presses the adhesive sheet 12 on the wafer 10 and thus the adhesive sheet 12 is pressed against the sealing ring 220, as the sealing ring 220 expands in volume due to a pressure of the fluid supply part 223, compression forces of the cover pressing part 143 of the ring cover 140 and the sealing ring 220 may be further increased. Accordingly, the sealing performance of the ring cover 140 and the sealing ring 220 can be further improved.

Figure 25:
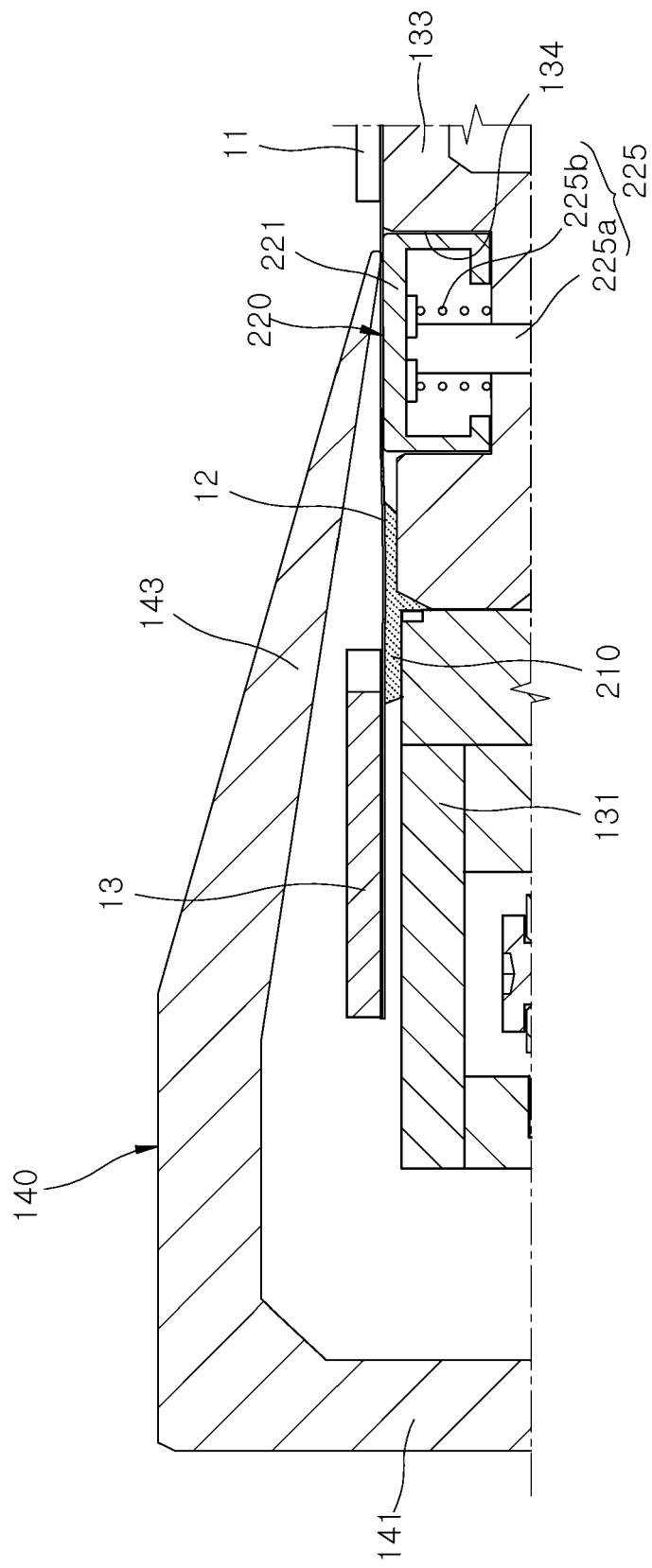
FIG. 25 is a schematic cross-sectional view illustrating a state in which a sealing force reinforcement part is installed to press the sealing ring in the wafer processing apparatus according to the first embodiment of the present invention.

FIG. 25 is a schematic cross-sectional view illustrating a state in which a sealing force reinforcement part is installed to press the sealing ring in the wafer processing apparatus according to the first embodiment of the present invention.

Referring to FIG. 25, the vacuum chuck 130 further includes a sealing force reinforcement part 225a installed in the deformation space 221 to elastically support the sealing ring 220. The sealing force reinforcement part 225a includes a reinforcement rod 225a installed to support the sealing ring 220 inside the deformation space 221, and a reinforcement spring 225b installed on the reinforcement rod 225a to push the reinforcement rod 225a toward the sealing ring 220. Therefore, in a state in which the ring cover 140 presses the sealing ring 220, since a restoring force of the sealing ring 220 itself and an elastic force of the sealing force reinforcement part 225a are applied to the adhesive sheet 12 on the wafer 10, the sealing performance of the ring cover 140 and the sealing ring 220 can be further improved.

Figure 26:
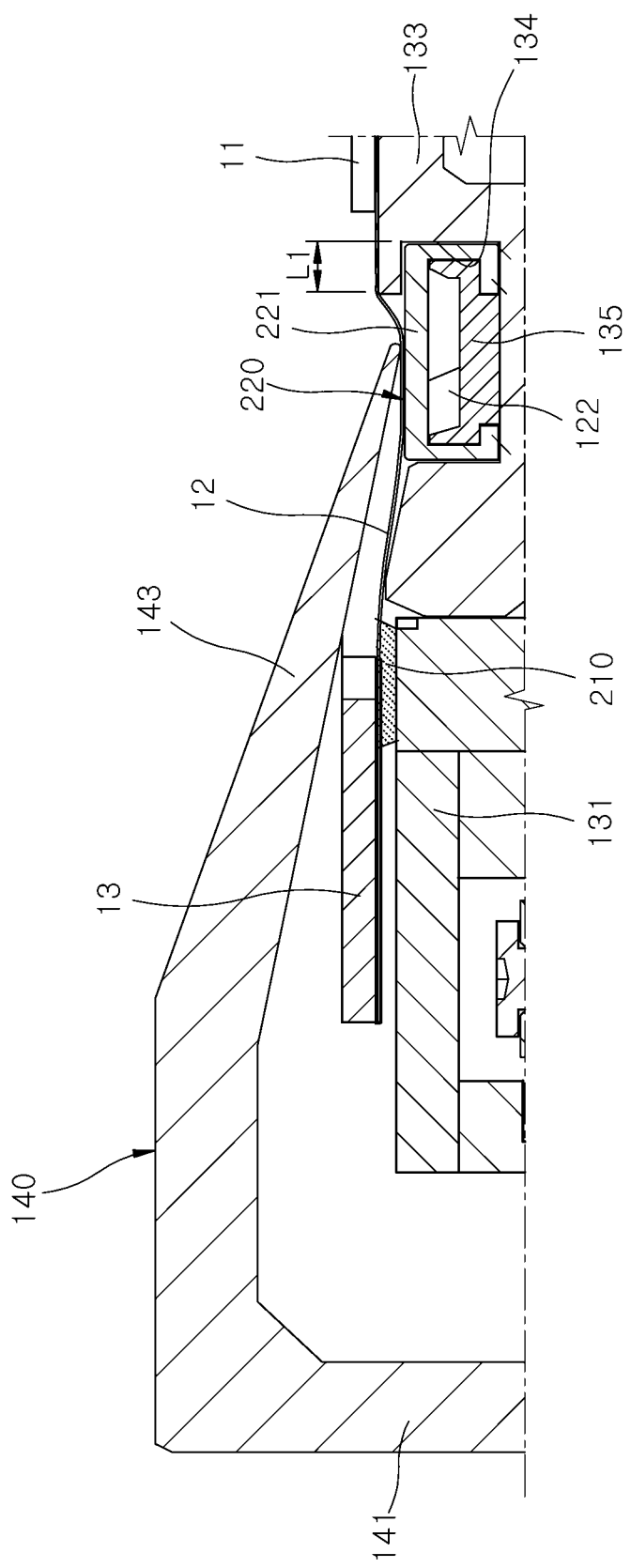
FIG. 26 is a schematic cross-sectional view illustrating a state in which an inner side of the sealing ring is embedded into the 2 chuck in the wafer processing apparatus according to the first embodiment of the present invention.

FIG. 26 is a schematic cross-sectional view illustrating a state in which an inner side of the sealing ring is embedded into the 2 chuck in the wafer processing apparatus according to the first embodiment of the present invention.

Referring to FIG. 26, an inner side of the sealing ring 220 is disposed to be embedded below an outer circumferential surface of the vacuum chuck 130. In this case, a central portion in a width direction of the sealing ring 220 is located closer to the outer circumferential surface of the vacuum chuck 130. Therefore, since the portion of the adhesive sheet 12 spaced approximately 1 mm from the outermost circumference of the die 11 of the wafer 10 faces the central portion in the width direction of the sealing ring 220 or faces a periphery of the central portion, an end portion of the cover pressing part 143 of the ring cover 140 may press the central portion in the width direction of the sealing ring 220 or the periphery of the central portion. Accordingly, the sealing performance of the ring cover 140 and the sealing ring 220 can be further improved. In addition, since a deformation amount of the sealing ring 220 is increased when the ring cover 140 presses, it is possible to relatively reduce the pressing force of the ring cover 140.

Figure 27:
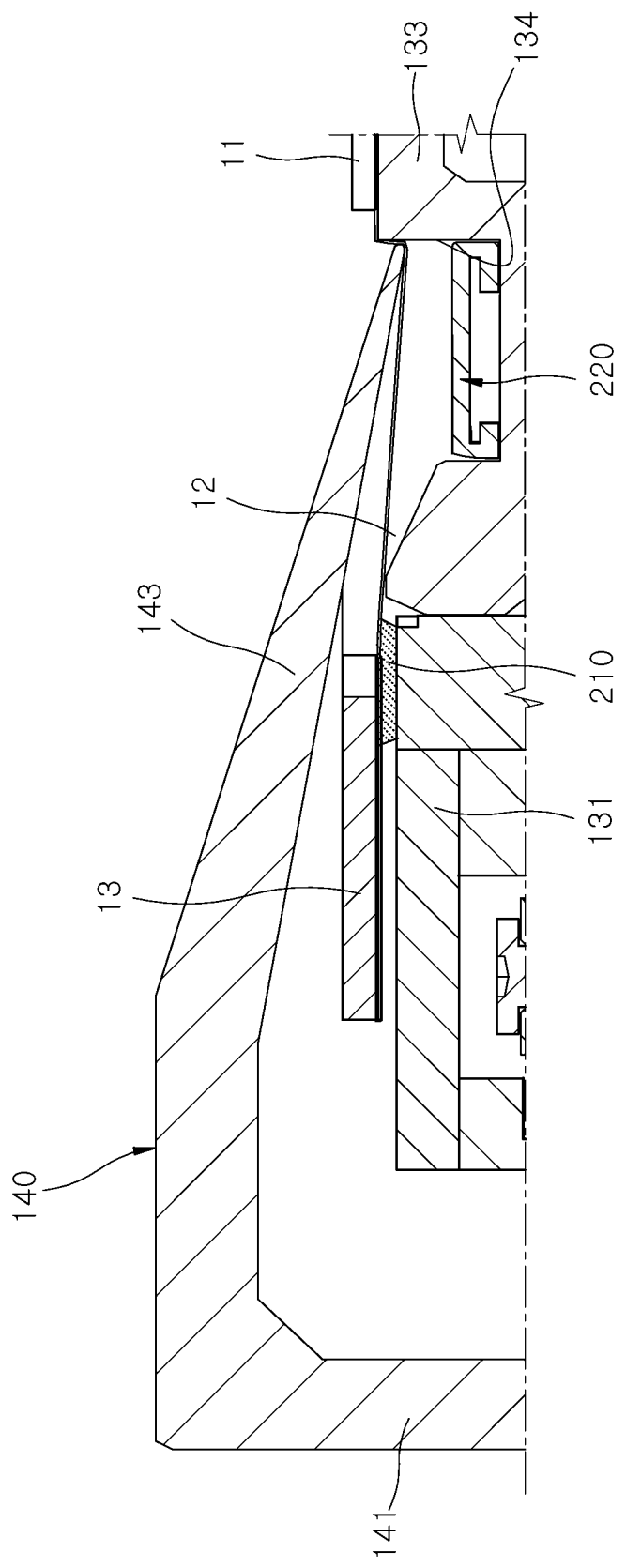
FIG. 27 is a schematic cross-sectional view illustrating a state in which the ring cover presses an adhesive sheet and seals a vacuum chuck in the wafer processing apparatus according to the first embodiment of the present invention.

FIG. 27 is a schematic cross-sectional view illustrating a state in which the ring cover presses an adhesive sheet and seals a vacuum chuck in the wafer processing apparatus according to the first embodiment of the present invention.

Referring to FIG. 27, a sealing groove 134 is formed on the outer circumferential surface of the vacuum chuck 130 to allow the sealing ring 220 to be disposed, and the ring cover 140 presses the portion of the adhesive sheet 12 facing the sealing groove 134 and thus sealing is achieved due to tension of the adhesive sheet 12. When the ring cover 140 presses the portion of the adhesive sheet 12 facing the sealing groove 134, the adhesive sheet 12 expands and thus the tension of the adhesive sheet 12 is applied to the cover pressing part 143 of the ring cover 140. Therefore, an infiltration of the treatment solution between the ring cover 140 and the adhesive sheet 12 may be prevented using the tension of the adhesive sheet 12 and the pressing force of the ring cover 140.

A wafer processing method of the wafer processing apparatus, which is configured as described above, according to one embodiment of the present invention will be described.

The wafer processing method of the wafer processing apparatus includes a substrate etching method of etching the wafer 10 using an etching solution, and a substrate cleaning method of cleaning the wafer 10 using a cleaning solution. The substrate etching method and the substrate cleaning method will be sequentially described below.

First, the substrate etching method of the wafer processing method will be described.

Figure 28:
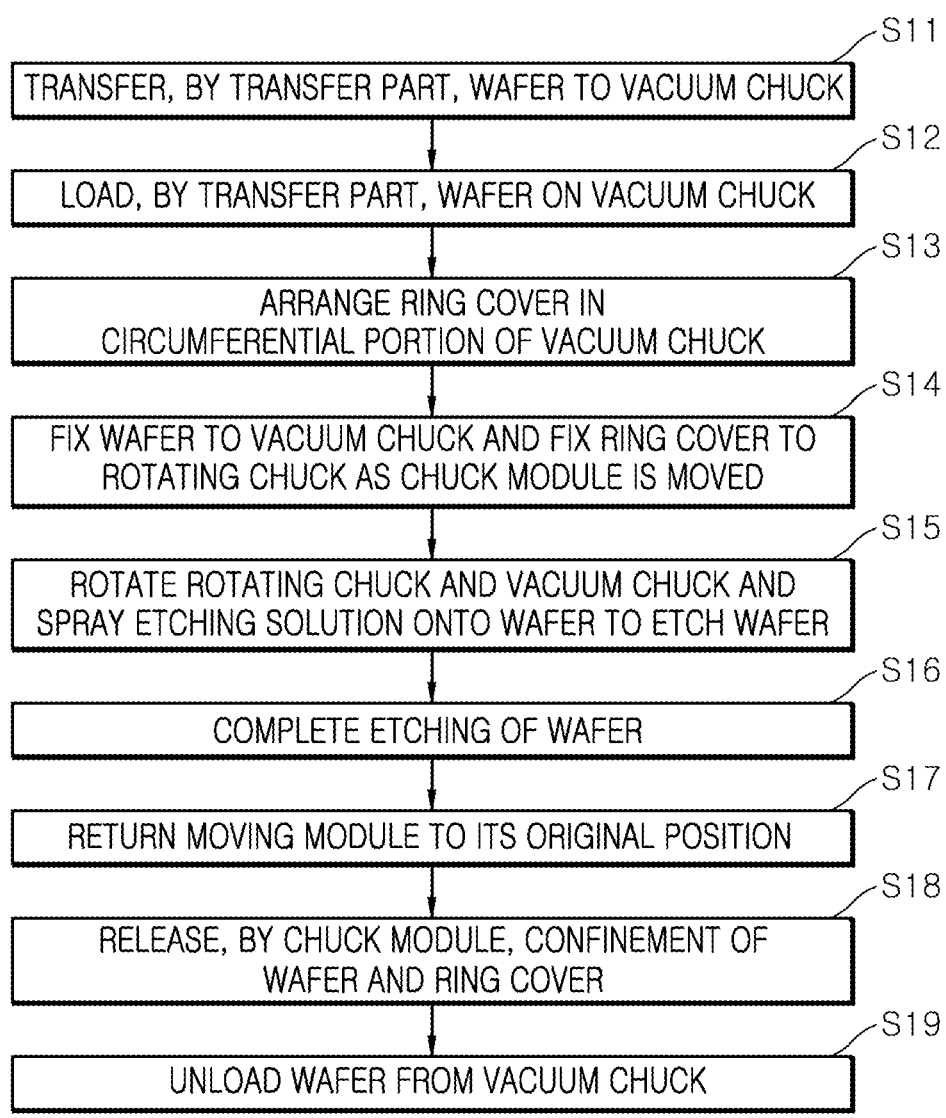
FIG. 28 is a schematic flowchart illustrating the substrate etching method in the wafer processing method according to a first embodiment of the present invention.

FIG. 28 is a schematic flowchart illustrating the substrate etching method in the wafer processing method according to a first embodiment of the present invention.

Referring to FIG. 28, a transfer part (not shown) transfers the wafer 10 to the vacuum chuck 130 (S11). In this case, the transfer part picks up and moves the wafer 10 above the vacuum chuck 130.

The transfer part loads the wafer 10 on the vacuum chuck 130 (S12). In this case, as the transfer part descends, the wafer 10 is mounted at a mounting position of the vacuum chuck 130.

The ring cover 140 is disposed on a circumferential portion of the vacuum chuck 130 (S13). In this case, since the engagement pin 145 of the rotating chuck 120 is inserted into the engagement groove 147 of the ring cover 140, the ring cover 140 is seated on the circumferential portion of the vacuum chuck 130.

As the chuck module 150 is moved, the wafer 10 is fixed to the vacuum chuck 130, and the ring cover 140 is fixed to the rotating chuck 120 (S14). In this case, the chuck rotating part 155 rotates the chuck base 151 at a predetermined angle about a rotation center of the vacuum chuck 130. As the chuck base 151 is rotated, the plurality of first chuck links 160 and the plurality of second chuck links 180 are moved toward a central portion of the vacuum chuck 130. The plurality of wafer confining parts 170 fix the retainer ring 13 on the wafer 10 to the vacuum chuck 130, and the plurality of cover confining parts 190 fix the ring cover 140 to the rotating chuck 120. Therefore, as the chuck base 151 is rotated at the predetermined angle, the wafer confining parts 170 and the cover confining parts 190 are simultaneously moved to fix the wafer 10 and the ring cover 140.

In addition, since the moving module 200 remains in a stationary state in an etching process, the vacuum chuck 130 or the chuck module 150 are not moved.

The rotating chuck 120 and the vacuum chuck 130 are rotated, and an etching solution is sprayed onto the wafer 10 to etch the wafer 10 (S15). The etching solution sprayed onto the wafer 10 flows radially due to a centrifugal force of the vacuum chuck 130 to etch the wafer 10. In addition, since the ring cover 140 presses the adhesive sheet 12 on the wafer 10, the ring cover 140 prevents the etching solution from infiltrating into the retainer ring 13 on the wafer 10. Accordingly, it is possible to prevent outer structures of the retainer ring 13 from being damaged due to the etching solution.

A controller determines whether an etching time of the wafer 10 is completed (S16). When the etching time of the wafer 10 is completed, the rotation of the rotating chuck 120 and the vacuum chuck 130 is stopped.

The moving module 200 returns to its original position, and the chuck module 150 releases confinement of the wafer 10 and the ring cover 140 (S17 and S18). In this case, the chuck rotating part 155 rotates the chuck base 151 at a predetermined angle about a rotation center of the vacuum chuck 130. As the chuck base 151 is rotated, the plurality of first chuck links 160 and the plurality of second chuck links 180 are moved outward from the vacuum chuck 130. The plurality of wafer confining parts 170 release the retainer ring 13 on the wafer 10 from the vacuum chuck 130, and the plurality of cover confining parts 190 release the ring cover 140 from the rotating chuck 120. Therefore, as the chuck base 151 is rotated at the predetermined angle, the wafer confining parts 170 and the cover confining parts 190 are simultaneously moved to release the wafer 10 and the ring cover 140.

A discharge part (not shown) unloads the wafer 10 from the vacuum chuck 130 (S19). The discharge part picks up and raises the wafer 10 and then moves the wafer 10 outward from the vacuum chuck 130.

Next, the substrate cleaning method of the wafer processing method will be described.

Figure 29:
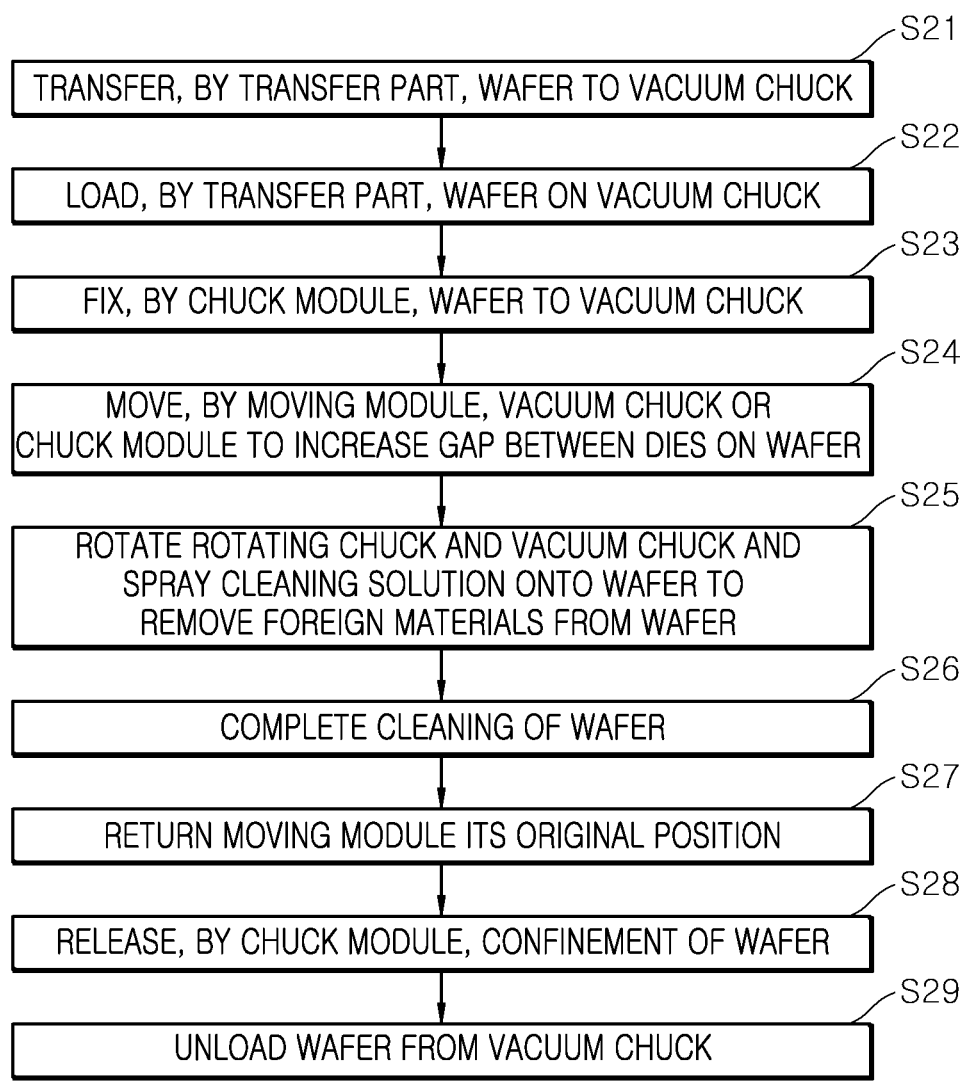
FIG. 29 is a schematic flowchart illustrating the substrate cleaning method in the wafer processing method according to the first embodiment of the present invention.

FIG. 29 is a schematic flowchart illustrating the substrate cleaning method in the wafer processing method according to the first embodiment of the present invention.

Referring to FIG. 29, the transfer part (not shown) transfers the wafer 10 to the vacuum chuck 130 (S21). In this case, the transfer part picks up and moves the wafer 10 above the vacuum chuck 130.

The transfer part loads the wafer 10 on the vacuum chuck 130 (S22). In this case, as the transfer part descends, the wafer 10 is mounted at a mounting position of the vacuum chuck 130. Alternatively, the ring cover 140 may not be disposed in the circumferential portion of the vacuum chuck 130.

As the chuck module 150 is moved, the wafer 10 is fixed to the vacuum chuck 130 (S23). In this case, the chuck rotating part 155 rotates the chuck base 151 at a predetermined angle about a rotation center of the vacuum chuck 130. As the chuck base 151 is rotated, the plurality of first chuck links 160 are moved toward the central portion of the vacuum chuck 130. The plurality of wafer confining parts 170 press and fix the retainer ring 13 on the wafer 10 to the vacuum chuck 130. The plurality of cover confining parts 190 are simultaneously moved with the plurality of first chuck links 160 due to rotation of the chuck base 151.

The moving module 200 moves the vacuum chuck 130 or the chuck module 150 to increase a gap between the dies 11 of the wafer 10 (S24). In this case, the first vacuum chuck 131 forms a vacuum pressure to suction the wafer 10, and the moving module 200 moves the second vacuum chuck 133 or the chuck module 150. When the moving module 200 is moved in a state in which the chuck module 150 fixes the retainer ring 13 on the wafer 10 to the circumferential portion of the vacuum chuck 130, the wafer 10 is pressed due to the movement of the moving module 200. In this case, as the adhesive sheet 12 on the wafer 10 is pulled in a radial direction, the adhesive sheet 12 is stretched in the radial direction, and as the adhesive sheet 12 is stretched in the radial direction, the gaps between the plurality of dies 11 are increased.

Configurations in which the moving module 200 moves the vacuum chuck 130 or the chuck module 150 will be described in detail below.

The moving module 200 moves the vacuum chuck 130 upward (see FIGS. 3 and 4). In this case, the moving module 200 is installed in the rotating chuck 120 to be connected to the first vacuum chuck 131 and the second vacuum chuck 133. In addition, the moving module 200 moves the vacuum chuck 130 upward, and the rotating chuck 120 is fixed in position. As the moving module 200 is driven, the vacuum chuck 130 is moved upward and the rotating chuck 120 is not raised so that, in a state in which the retainer ring 13 on the wafer 10 is fixed, the adhesive sheet 12 is raised to be stretched in the radial direction. As the adhesive sheet 12 is stretched in the radial direction, the gaps between the plurality of dies 11 are increased.

The moving module 200 moves the chuck module 150 downward (see FIG. 5). In this case, the moving module 200 is installed to be raisable and lowerable on the circumferential portion of the vacuum chuck 130. In addition, a structure (not shown) supporting the chuck module 150 to be raisable and lowerable may be installed on the circumferential portion of the rotating chuck 120. As the moving module 200 is driven, the chuck module 150 is moved downward and the rotating chuck 120 and the vacuum chuck 130 are not raised so that, in a state in which the plurality of dies 11 of the wafer 10 are fixed in position on the vacuum chuck 130, the retainer ring 13 is lowered and thus the adhesive sheet 12 is stretched in the radial direction. As the adhesive sheet 12 is stretched in the radial direction, the gaps between the plurality of dies 11 are increased.

The moving module 200 moves the chuck module 150 upward (see FIG. 6). In this case, the moving module 200 is installed to be raisable and lowerable in the circumferential portion of the vacuum chuck 130. In addition, the adhesive sheet 12 between the outermost circumference of the die 11 and the retainer ring 13 on the wafer 10 is pressed by a support. The ring cover 140 may be applied as the support. In addition, a structure (not shown) supporting the chuck module 150 to be raisable and lowerable may be installed in the circumferential portion of the rotating chuck 120. As the moving module 200 is driven, the chuck module 150 is moved upward and the rotating chuck 120 and the vacuum chuck 130 are not raised so that, in a state in which the plurality of dies 11 of the wafer 10 are fixed in position on the vacuum chuck 130, the retainer ring 13 is raised and thus the adhesive sheet 12 is stretched in the radial direction. As the adhesive sheet 12 is stretched in the radial direction, the gaps between the plurality of dies 11 are increased.

The moving module 200 includes the medium flow path 201 and the moving rod 203 (see FIGS. 8 and 9). The medium flow path 201 is formed to supply a moving medium supplied to the driver 110. The medium flow path 201 may be disposed inside the rotating shaft 111 in the lengthwise direction of the rotating shaft 111. The moving medium may be air or gas. The moving rod 203 is installed to be raised or lowered due to a pressure of the moving medium and installed to be in contact with a lower portion of the vacuum chuck 130. A restoring spring may be installed in the moving rod 203 to restore the moving medium to its original position when the pressure of the moving medium is released. The moving rod 203 and the medium flow path 201 may be installed as a plurality of moving rods 203 and a plurality of medium flow paths 201 in a circumferential direction of the rotating shaft 111. When the plurality of moving rods 203 raise or lower the vacuum chuck 130, the vacuum chuck 130 may be raised or lowered while being maintained in a horizontal state.

The moving module 200 may include the cylinder 205 for moving the vacuum chuck 130 or the chuck module 150. The cylinder 205 may be disposed below the vacuum chuck 130 or disposed in the circumferential portion of the vacuum chuck 130. The cylinder 205 may be installed in the rotating chuck 120 to raise or lower the vacuum chuck 130 or installed in the rotating chuck 120 to move the chuck module 150. Since the cylinder 205 is driven as a fluid is supplied to or discharged from the cylinder 205, the vacuum chuck 130 or the chuck module 150 may be moved. When the solenoid 207 is applied as the moving module 200, since there is no need to install a separate medium flow path 201 in the driver 110, the driver 110 may be formed to have a simplified structure.

The moving module 200 may include the solenoid 207 for moving the vacuum chuck 130 or the chuck module 150 (see FIG. 11). The solenoid 207 may be disposed below the vacuum chuck 130 or disposed in the circumferential portion of the vacuum chuck 130. The solenoid 207 may be installed in the rotating chuck 120 to raise or lower the vacuum chuck 130 or installed in the rotating chuck 120 to move the chuck module 150. Since the solenoid 207 is driven as power is supplied to or blocked from the cylinder 207, the vacuum chuck 130 or the chuck module 150 may be moved. When the solenoid 207 is applied as the moving module 200, since there is no need to install a separate medium flow path 201 in the driver 110, the driver 110 may be formed to have a simplified structure.

The rotating chuck 120 and the vacuum chuck 130 are rotated, and a cleaning solution is sprayed onto the wafer 10 to remove foreign materials from the wafer 10 (S25). The cleaning solution sprayed onto the wafer 10 flows radially due to a centrifugal force of the vacuum chuck 130 to clean the wafer 10. In this case, since the adhesive sheet 12 is stretched in the radial direction due to the movement of the moving module 200, the gaps between the plurality of dies 11 are increased. When the cleaning solution is sprayed onto the plurality of dies 11 in a state in which the gaps between the plurality of dies 11 are increased, foreign materials attached on the surfaces of the plurality of dies 11 as well as foreign materials located in the gaps between the plurality of dies 11 may be easily removed due to the cleaning solution. Therefore, cleaning performance with respect to the foreign materials on the wafer 10 may be significantly improved, and a removal time of the foreign materials may be reduced. In addition, as the cleaning performance of the wafer 10 is significantly improved, a defective rate in the wafer 10 may be significantly reduced.

The controller determines whether a cleaning time of the wafer 10 is completed (S26). When the cleaning time of the wafer 10 is completed, the rotation of the rotating chuck 120 and the vacuum chuck 130 is stopped.

The moving module 200 returns to its original position, and the chuck module 150 releases confinement of the wafer 10 (S27 and S28). In this case, the chuck rotating part 155 rotates the chuck base 151 at a predetermined angle about a rotation center of the vacuum chuck 130. As the chuck base 151 is rotated, the plurality of first chuck links 160 are moved outward from the vacuum chuck 130. The plurality of wafer confining parts 170 release the retainer ring 13 on the wafer 10 from the vacuum chuck 130.

The discharge part (not shown) unloads the wafer 10 from the vacuum chuck 130 (S29). The discharge part picks up and raises the wafer 10 and then moves the wafer 10 outward from the vacuum chuck 130.

In accordance with the present invention, since a plurality of first chuck links and a plurality of wafer confining part are simultaneously driven as a chuck base is rotated, a wafer can be confined to a vacuum chuck using one chuck rotating part. Accordingly, it is possible to reduce the number of chuck rotating parts installed in the chuck module.

In addition, in accordance with the present invention, since a ring cover presses an adhesive sheet on the wafer to seal a circumferential portion of the vacuum chuck, it is possible to minimize the adhesive sheet being damaged due to an etching solution and to prevent the rotating chuck and the vacuum chuck from being contaminated or damaged due to the etching solution.

In addition, in accordance with the present invention, since the wafer and the ring cover are simultaneously fixed to the vacuum chuck and the rotating chuck using one chuck base and one chuck rotating part, a structure of a wafer processing apparatus can be simplified.

While the present invention has been described with reference to the embodiments shown in the drawings these embodiments are merely illustrative and it should be understood that various modifications and equivalent other embodiments can be derived by those skilled in the art on the basis of the embodiments.

Therefore, the true technical scope of the present invention should be defined by the appended claims.

What is claimed is:

1. A wafer processing apparatus comprising:
a vacuum chuck on which a wafer is seated;
a ring cover disposed along a circumferential portion of the vacuum chuck to press the wafer to seal the circumferential portion of the vacuum chuck; and
a sealing ring pressed against an adhesive sheet on the wafer and pressed by the ring cover,
wherein a deformation space is formed inside the sealing ring to allow the sealing ring to be deformed when the ring cover presses, and
wherein a hook portion is formed on the vacuum chuck, and the hook portion confines the sealing ring to prevent the sealing ring from being separated from the vacuum chuck.

2. The wafer processing apparatus of claim 1, wherein a sealing protrusion is formed on the ring cover to be pressed against the sealing ring.

3. The wafer processing apparatus of claim 1, further comprising a fluid supply part connected to the sealing ring to supply or discharge a fluid to or from the deformation space.

4. The wafer processing apparatus of claim 1, wherein an inner side of the sealing ring is disposed to be buried below an outer circumferential surface of the vacuum chuck.

5. The wafer processing apparatus of claim 1, wherein:
- a sealing groove is formed on an outer circumferential surface of the vacuum chuck to allow the sealing ring to be disposed in the sealing groove; and
- the ring cover presses a portion of the adhesive sheet facing the sealing groove to perform sealing due to tension of the adhesive sheet.

6. The wafer processing apparatus of claim 1, wherein the ring cover presses an adhesive sheet on the wafer to prevent a supply solution from infiltrating into a retainer ring on the wafer.

7. The wafer processing apparatus of claim 1, further comprising a plurality of suction pads installed on a vacuum port of the vacuum chuck to suction a retainer ring on the wafer.

8. The wafer processing apparatus of claim 7, wherein the suction pad includes:
- a suction body disposed above the vacuum port to suction the wafer;
- a flatness management part formed to be inclined toward a central portion of the suction body from a lower circumferential portion thereof to allow the vacuum port to be fitted; and
- a press-fitting fixing part formed in the flatness management part to be press-fitted in a fixing groove of the vacuum chuck.

* * * * *